(12) United States Patent
Narendran et al.

(10) Patent No.: US 7,703,942 B2
(45) Date of Patent: Apr. 27, 2010

(54) HIGH-EFFICIENT LIGHT ENGINES USING LIGHT EMITTING DIODES

(75) Inventors: Nadarajah Narendran, Clifton Park, NY (US); Jean Paul Freyssinier, Troy, NY (US); Yimin Gu, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 181 days.

(21) Appl. No.: 11/642,154

(22) Filed: Dec. 20, 2006

(65) Prior Publication Data

US 2008/0054281 A1 Mar. 6, 2008

Related U.S. Application Data

(60) Provisional application No. 60/841,652, filed on Aug. 31, 2006.

(51) Int. Cl.
*F21V 9/00* (2006.01)
(52) U.S. Cl. .................. 362/231; 362/800; 362/293; 362/84; 362/246; 362/240
(58) Field of Classification Search .................. 362/231, 362/800, 293, 84, 246, 237, 240
See application file for complete search history.

(56) References Cited

U.S. PATENT DOCUMENTS

| | | | |
|---|---|---|---|
| 3,593,055 A | 7/1971 | Geusie et al. | |
| 3,760,237 A | 9/1973 | Jaffe | |
| 3,763,405 A | 10/1973 | Mitsuhata | |
| 3,875,456 A | 4/1975 | Kano et al. | |
| 4,729,076 A | 3/1988 | Masami et al. | |
| 5,187,765 A | 2/1993 | Muehlemann et al. | |
| 5,208,462 A | 5/1993 | O'Connor et al. | |
| 5,461,547 A | 10/1995 | Ciupke et al. | |
| 5,477,430 A | 12/1995 | LaRosa | |
| 5,499,138 A | 3/1996 | Iba | |
| 5,535,230 A | 7/1996 | Abe | |
| 5,622,423 A | 4/1997 | Lee | |
| 5,777,433 A | 7/1998 | Lester et al. | |
| 5,808,409 A | 9/1998 | Matsuda et al. | |

(Continued)

FOREIGN PATENT DOCUMENTS

DE    3632743 A1    3/1988

(Continued)

OTHER PUBLICATIONS

Search Report from International Application Serial No. PCT/US2007/012311 dated Feb. 15, 2008.

(Continued)

*Primary Examiner*—Sandra L O'Shea
*Assistant Examiner*—Jessica L McMillan
(74) *Attorney, Agent, or Firm*—RatnerPrestia

(57) ABSTRACT

A light emitting apparatus having a light source for emitting short wavelength radiation and an optic device configured to receive the radiation emitted from the light source. A device directs at least some of the short wavelength radiation emitted from the light source into the optic device and a down conversion material receives at least some of the short wavelength radiation directed into the optic device in one spectral region and emits the radiation in another spectral region.

35 Claims, 10 Drawing Sheets

U.S. PATENT DOCUMENTS

| | | |
|---|---|---|
| 5,813,752 A | 9/1998 | Singer et al. |
| 5,813,753 A | 9/1998 | Vriens et al. |
| 5,847,507 A | 12/1998 | Butterworth et al. |
| 5,959,316 A | 9/1999 | Lowery |
| 5,962,971 A | 10/1999 | Chen |
| 5,998,925 A | 12/1999 | Shimizu et al. |
| 6,007,209 A | 12/1999 | Pelka |
| 6,066,861 A | 5/2000 | Höhn et al. |
| 6,068,383 A | 5/2000 | Robertson et al. |
| 6,069,440 A | 5/2000 | Shimizu et al. |
| 6,084,250 A | 7/2000 | Jüstel et al. |
| 6,096,496 A | 8/2000 | Frankel |
| 6,155,699 A | 12/2000 | Miller et al. |
| 6,210,012 B1 | 4/2001 | Broer |
| 6,245,259 B1 | 6/2001 | Höhn et al. |
| 6,252,254 B1 | 6/2001 | Soules et al. |
| 6,294,800 B1 | 9/2001 | Duggal et al. |
| 6,350,041 B1 | 2/2002 | Tarsa et al. |
| 6,357,889 B1 | 3/2002 | Duggal et al. |
| 6,452,217 B1 | 9/2002 | Wojnarowski et al. |
| 6,469,322 B1 | 10/2002 | Srivastava et al. |
| 6,483,196 B1 | 11/2002 | Wojnarowski et al. |
| 6,491,412 B1 | 12/2002 | Bowman et al. |
| 6,501,102 B2 | 12/2002 | Mueller-Mach et al. |
| 6,513,949 B1 | 2/2003 | Marshall et al. |
| 6,576,930 B2 | 6/2003 | Reeh et al. |
| 6,576,935 B2 | 6/2003 | Onishi et al. |
| 6,580,097 B1 | 6/2003 | Soules et al. |
| 6,580,224 B2 | 6/2003 | Ishii et al. |
| 6,600,175 B1 | 7/2003 | Baretz et al. |
| 6,603,258 B1 | 8/2003 | Mueller-Mach et al. |
| 6,608,332 B2 | 8/2003 | Shimizu et al. |
| 6,614,170 B2 | 9/2003 | Wang et al. |
| 6,614,179 B1 | 9/2003 | Shimizu et al. |
| 6,616,862 B2 | 9/2003 | Srivastava et al. |
| 6,630,691 B1 | 10/2003 | Mueller-Mach et al. |
| 6,635,363 B1 | 10/2003 | Duclos et al. |
| 6,635,987 B1 | 10/2003 | Wojnarowski et al. |
| 6,653,765 B1 | 11/2003 | Levinson et al. |
| 6,686,676 B2 | 2/2004 | McNulty et al. |
| 6,686,691 B1 | 2/2004 | Mueller et al. |
| 6,692,136 B2 | 2/2004 | Marshall et al. |
| 6,696,703 B2 | 2/2004 | Mueller-Mach et al. |
| 6,734,467 B2 | 5/2004 | Schlereth et al. |
| 6,791,259 B1 | 9/2004 | Stokes et al. |
| 6,793,374 B2 | 9/2004 | Begemann |
| 6,796,690 B2 | 9/2004 | Bohlander |
| 6,799,865 B2 | 10/2004 | Ellens et al. |
| 6,809,342 B2 | 10/2004 | Harada |
| 6,833,565 B2 | 12/2004 | Su et al. |
| 6,867,542 B1 | 3/2005 | Sun et al. |
| 6,936,857 B2 | 8/2005 | Doxsee et al. |
| 7,002,291 B2 | 2/2006 | Ellens et al. |
| 7,026,656 B2 | 4/2006 | Lin et al. |
| 7,040,774 B2 | 5/2006 | Beeson et al. |
| 7,048,385 B2 | 5/2006 | Beeson et al. |
| 7,049,740 B2 | 5/2006 | Takekuma |
| 7,052,152 B2 | 5/2006 | Harbers et al. |
| 7,192,161 B1 | 3/2007 | Cleaver et al. |
| 7,498,734 B2 | 3/2009 | Suehiro et al. |
| 2002/0003233 A1 | 1/2002 | Mueller-Mach et al. |
| 2002/0030444 A1 | 3/2002 | Muller-Mach et al. |
| 2002/0047516 A1 | 4/2002 | Iwasa et al. |
| 2002/0084745 A1 | 7/2002 | Wang et al. |
| 2002/0167014 A1 | 11/2002 | Schlereth et al. |
| 2003/0030060 A1 | 2/2003 | Okazaki |
| 2003/0067773 A1 | 4/2003 | Marshall et al. |
| 2003/0174499 A1 | 9/2003 | Bohlander |
| 2003/0189829 A1 | 10/2003 | Shimizu et al. |
| 2003/0201451 A1 | 10/2003 | Suehiro et al. |
| 2003/0218880 A1 | 11/2003 | Brukilacchio |
| 2003/0230751 A1 | 12/2003 | Harada |
| 2004/0016938 A1 | 1/2004 | Baretz et al. |
| 2004/0056260 A1 | 3/2004 | Slater, Jr. et al. |
| 2004/0116033 A1 | 6/2004 | Ouderkirk et al. |
| 2004/0124758 A1 | 7/2004 | Danielson et al. |
| 2004/0129945 A1 | 7/2004 | Uemura |
| 2004/0203312 A1 | 10/2004 | Bortscheller et al. |
| 2004/0208210 A1 | 10/2004 | Inoguchi |
| 2004/0217364 A1* | 11/2004 | Tarsa et al. ............ 257/89 |
| 2004/0233664 A1 | 11/2004 | Beeson et al. |
| 2004/0263073 A1 | 12/2004 | Baroky et al. |
| 2004/0263074 A1 | 12/2004 | Baroky et al. |
| 2005/0041424 A1 | 2/2005 | Ducharme |
| 2005/0073495 A1 | 4/2005 | Harbers et al. |
| 2005/0093430 A1 | 5/2005 | Ibbetson et al. |
| 2005/0116635 A1 | 6/2005 | Walson et al. |
| 2005/0117125 A1 | 6/2005 | Minano et al. |
| 2005/0117366 A1 | 6/2005 | Simbal |
| 2005/0135117 A1 | 6/2005 | Lamb et al. |
| 2005/0162849 A1 | 7/2005 | Keuper |
| 2005/0174775 A1 | 8/2005 | Conner |
| 2005/0185419 A1 | 8/2005 | Holman et al. |
| 2005/0211991 A1 | 9/2005 | Mori et al. |
| 2005/0219476 A1 | 10/2005 | Beeson et al. |
| 2005/0237488 A1 | 10/2005 | Yamasaki et al. |
| 2005/0248958 A1 | 11/2005 | Li |
| 2005/0265029 A1 | 12/2005 | Epstein et al. |
| 2005/0276553 A1 | 12/2005 | Kazakevich et al. |
| 2005/0280785 A1 | 12/2005 | Beeson et al. |
| 2006/0002141 A1 | 1/2006 | Ouderkirk et al. |
| 2006/0007553 A1 | 1/2006 | Bogner |
| 2006/0034082 A1 | 2/2006 | Park et al. |
| 2006/0034084 A1 | 2/2006 | Matsuura et al. |
| 2006/0044523 A1 | 3/2006 | Teijido et al. |
| 2006/0044803 A1 | 3/2006 | Edwards |
| 2006/0049416 A1 | 3/2006 | Baretz |
| 2006/0066192 A1 | 3/2006 | Beeson et al. |
| 2006/0067078 A1 | 3/2006 | Beeson et al. |
| 2006/0071225 A1 | 4/2006 | Beeson et al. |
| 2006/0072314 A1 | 4/2006 | Rains |
| 2006/0091788 A1 | 5/2006 | Yan |
| 2006/0097385 A1* | 5/2006 | Negley ............ 257/722 |
| 2006/0104090 A1 | 5/2006 | Lengyel et al. |
| 2006/0118805 A1 | 6/2006 | Camras et al. |
| 2006/0170335 A1 | 8/2006 | Cho et al. |
| 2006/0186429 A1 | 8/2006 | Chew |
| 2006/0202219 A1 | 9/2006 | Ohashi |

FOREIGN PATENT DOCUMENTS

| | | |
|---|---|---|
| EP | 1 160 883 A | 12/2001 |
| EP | 1 686 630 A | 8/2006 |
| EP | 1 691 425 A | 8/2006 |
| EP | 1 696 496 A | 8/2006 |
| JP | 2001-243807 | 9/2001 |
| JP | 2001-243821 | 9/2001 |
| JP | 2002-299694 | 10/2002 |
| JP | 2004-055160 | 2/2004 |
| JP | 2004-055229 | 2/2004 |
| WO | WO 00/24064 A | 4/2000 |
| WO | WO 01/40702 A1 | 6/2001 |
| WO | WO 2005/107420 | 11/2005 |
| WO | WO 2006/087651 | 8/2006 |

OTHER PUBLICATIONS

Akos Borbely, et al., Prediction of Light Extraction Efficiency of LEDs by Ray Trace Simulation, Third International Conference on Solid State LIghting, Proc. of SPIE vol. 5187, pp. 301-308.

Song Jae Lee, Study of Photon Extraction Efficiency in InGaN Light-Emitting Diodes Depending on Chip Structures and Chip-Mount Schemes, Optical Engineering, Jan. 2006, vol. 45(1), pp. 014601-1-014601-14.

D.A. Vanderwater et al., High-Brightness AlGaInP Light Emitting Diodes, Proceedings of the IEE, vol. 85, No. 11, Nov. 1997, pp. 1752-1764.

Kenichi Yamada et al., Optical Simulation of Light Source Devices Composed of Blue LEDs and YAG Phosphor, J. Light & Vis. Env. vol. 27, No. 2, 2003, pp. 71-74.

N. Narendran et al., Solid-state Lighting: failure analysis of white LEDs, Journal of Crystal Growth, 268 (2004) pp. 449-456.

M. Arik et al., Effects of Localized Heat Generations Due to the Color Conversion in Phosphor Particles and Layers of High Brightness Light Emitting Diodes, American Society of Mechanical Engineers (ASME), Proceedings of InterPACK '03, International Electronic Packaging Technical Conference and Exhibition, Maui, Hawaii, Jul. 2003, pp. 1-9, title page, copyright page and abstract page.

International Search Report of PCT International Application No. PCT/US2005/015736 dated Feb. 27, 2006 (3 pages).

Kim J.K. et al.: "Strongly Enhanced Phosphor Efficiency in GaInN White Light-Emitting Diodes Using Remote Phosphor configuration and Diffuse Reflector Cup" Japanese Journal of Applied Physics, Part 2 (Letters) Japan Soc. Apl. Phys Japan, vol. 44, No. 21, 2005, pp. L649-L651.

Search Report for International Application Serial No. PCT/US2007/013132 dated Dec. 3, 2007.

Krames M.R. et al.: "High-power III-nitride emitters for solid-state lighting" Phys. Stat. sol. (a) Wiley-VCH Verlag Berlin GmbH, Berlin, vol. 192, No. 2 (2002) pp. 237-245.

Search Report for International Application Serial No. PCT/US2007/013132 dated Jan. 31, 2008.

European Search Report of Application No. EP 05 76 1021 dated Jun. 18, 2008.

United States Patent and Trademark Office Office Action for U.S. Appl. No. 11/642,089 dated Mar. 10, 2009.

First Office Action for Chinese Application No. 2005800222839 dated Jul. 8, 2008 (including English translation).

United States Patent and Trademark Office Office Action for U.S. Appl. No. 11/642,089 dated May 28, 2008.

United States Patent and Trademark Office Office Action for U.S. Appl. No. 10/583,105 dated Nov. 4, 2008.

USPTO Office Action in U.S. Appl. No. 11/644,815 dated Sep. 18, 2009.

USPTO Office Action in U.S. Appl. No. 11/644,815 dated Feb. 3, 2009.

USPTO Office Action in U.S. Appl. No. 11/642,089 dated Jul. 23, 2009.

European Office Action in EP Application No. 05 761 021.4 dated Oct. 8, 2009.

United States Patent and Trademark Office Office Action in U.S. Appl. No. 10/583,105 dated Jun. 19, 2009.

English language translation of the Third Office Action in Chinese Patent Application No. 200580022283.9 mailed on Jan. 22, 2010.

* cited by examiner

HIGH-EFFICIENT LIGHT ENGINES USING LIGHT EMITTING DIODES

CROSS REFERENCE TO RELATED APPLICATION

This application claims the benefit of priority to U.S. Provisional Application Ser. No. 60/841,652 filed Aug. 31, 2006, the contents of which is incorporated by reference herein.

BACKGROUND OF THE INVENTION

Solid state light emitting devices, including solid state lamps having light emitting diodes (LEDs), laser diodes (LDs), and resonant cavity LEDs (RCLEDs) are extremely useful, because they potentially offer lower fabrication costs and long term durability benefits over conventional incandescent and fluorescent lamps. Due to their long operation (burn) time and low power consumption, solid state light emitting devices frequently provide a functional cost benefit, even when their initial cost is greater than that of conventional lamps. Because large scale semiconductor manufacturing techniques may be used, many solid state lamps may be produced at extremely low cost.

In addition to applications such as indicator lights on home and consumer appliances, audio visual equipment, telecommunication devices and automotive instrument markings, LEDs have found considerable application in indoor and outdoor informational displays.

With the development of efficient LEDs that emit short wavelength (e.g., blue or ultraviolet (UV) radiation), it has become feasible to produce LEDs that generate white light through down conversion of a portion of the primary emission of the LED to longer wavelengths. Conversion of primary emissions of the LED to longer wavelengths is commonly referred to as down-conversion of the primary emission. An unconverted portion of the primary emission combines with the light of longer wavelengths to produce white light.

Phosphor conversion of a portion of the primary emission of the LED chip is attained by placing a phosphor layer in an epoxy that is used to fill the reflector cup which houses the LED chip within the LED lamp. The phosphor is in the form of a powder that is mixed into the epoxy prior to curing the epoxy. The uncured epoxy slurry containing the phosphor powder is then deposited onto the LED chip and subsequently cured.

The phosphor particles within the cured epoxy generally are randomly oriented and interspersed throughout the epoxy. A portion of the primary radiation emitted by the LED chip passes through the epoxy without impinging on the phosphor particles, and another portion of the primary radiation emitted by the LED chip impinges on the phosphor particles, causing the phosphor particles to emit longer wavelength radiation. The combination of the primary short wavelength radiation and the phosphor-emitted radiation produces white light.

Current state of the art phosphor-converted white LED (pc-LED) technology is inefficient in the visible spectrum. The light output for a single pc-white LED is below that of typical household incandescent lamps, which are approximately 10 percent efficient in the visible spectrum. An LED device having a comparable light output than that of a typical incandescent lamp necessitates a larger LED chip or a design having multiple LED chips. Moreover, a form of direct energy absorbing cooling must be incorporated to handle the temperature rise in the LED device itself. More particularly, the LED device becomes less efficient when heated to a temperature greater than 100° C., resulting in a declining return in the visible spectrum. The intrinsic phosphor conversion efficiency, for some phosphors, drops dramatically as the temperature increases above approximately 90° C. threshold. Other down conversion materials like quantum dots could start to decrease in efficiency from even lower temperatures, 25 degrees centigrade.

SUMMARY OF THE INVENTION

An exemplary embodiment of the invention is a light emitting apparatus having a light source for emitting short wavelength radiation and an optic device configured to receive the short wavelength radiation emitted from the light source. A device directs at least some of the short wavelength radiation emitted from the light source into the optic device and a down conversion material receives at least some of the short wavelength radiation directed into the optic device in one spectral region and emits radiation in at least one other spectral region.

Another embodiment of the invention is a light emitting apparatus having a light source for emitting multi-colored radiation and an optic device configured to receive at least a portion of the multi-colored radiation. A device directs at least some of the multi-colored radiation emitted by the radiation source into the optic device. A diffuser material coupled to the optic device receives at least some of the multi-colored radiation and converts the received multi-colored radiation into forward transferred radiation and back transferred radiation. The optic device is configured to extract at least a portion of the back transferred radiation from the optic device.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 12:
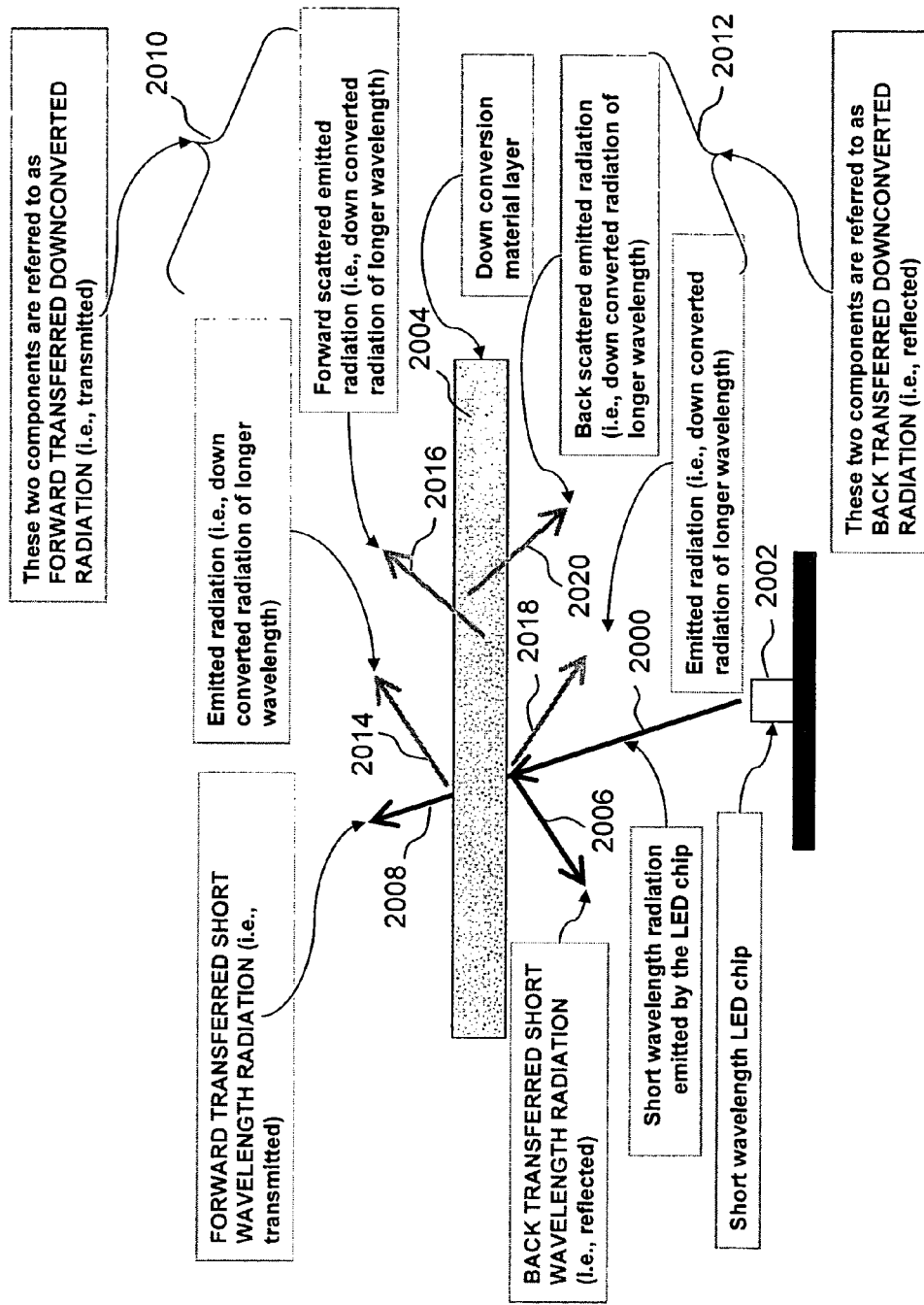
FIG. 12 is a diagram illustrating the exemplary radiation rays that result when an exemplary radiation ray from a short-wavelength LED chip impinges on a layer of down conversion material.

FIG. 12 is a diagram illustrating the exemplary radiation rays that may result when an exemplary radiation ray 2000 from a short-wavelength LED chip 2002 impinges on a layer of down conversion material 2004. The impingement of exemplary short-wavelength radiation 2000 from a short-wavelength source such as an LED chip 2002 onto a down conversion material layer 2004 may produce radiation with four components: back transferred short-wavelength radiation 2006 reflected from the down conversion material layer 2004; forward transferred short-wavelength radiation 2008 transmitted through the down conversion material layer 2004; forward transferred down-converted radiation 2010 transmitted through the down conversion material 2004; and back transferred down-converted radiation 2012 reflected from the down conversion material 2004. The four components may combine to produce white light.

Two of the four components 2010 and 2012 may each be comprised of two sub-components. One of the sub-components of forward transferred down-converted radiation may be emitted radiation 2014; i.e., down-converted radiation having a longer wavelength than the short-wavelength radiation that impinges onto the down conversion material layer 2004. The emitted radiation sub-component 2014 of forward transferred down-converted radiation may be produced by short-wavelength radiation 2000 impinging on particles of the down conversion material 2004 as it is transmitted through the down conversion material 2004. The second sub-component of forward transferred down-converted radiation may be forward scattered emitted radiation 2016; i.e., other down-converted radiation having a longer wavelength than the short-wavelength radiation 2000 that impinges onto the down conversion material layer 2004. The forward scattered emitted radiation sub-component 2016 of forward transferred down-converted radiation 2010 may be produced by short-wavelength radiation 2000 impinging on particles of the down conversion material 2004 and that also bounces back and forth on the particles of the down conversion material 2004 before being transmitted through the down conversion material 2004.

One of the sub-components of back transferred down-converted radiation 2012 may be emitted radiation 2020; i.e., down-converted radiation having a longer wavelength than the short-wavelength radiation 2000 that impinges onto the down conversion material layer 2004. The emitted radiation sub-component 2018 of back transferred down-converted radiation 2012 may be produced by short-wavelength radiation 2000 impinging on particles of the down conversion material 2004 as it is reflected from the down conversion material 2004. The second sub-component of back transferred down-converted radiation 2012 may be back scattered emitted radiation 2020; i.e., other down-converted radiation having a longer wavelength than the short-wavelength radiation 2000 that impinges onto the down conversion material layer 2004. The back scattered emitted radiation sub-component 2020 of back transferred down-converted radiation 2012 may be produced by short-wavelength radiation 2000 impinging on particles of the down conversion material 2004 and that also bounces back and forth on the particles of down conversion material 2004 before being reflected from the down conversion material 2004.

White light may be produced by the combinations of the various components discussed above. In the forward transferred direction (i.e., for radiation 2008, 2014, 2016, 2010 that is transmitted through the down conversion material layer), white light may be produced by the combination of forward transferred short-wavelength radiation 2008 with either or both of the sub-components 2014, 2016 of the forward transferred down-converted radiation 2010. That is, white light may be produced in the forward transferred direction by the combination of forward transferred short-wavelength light 2008 with transmitted emitted radiation 2014 and/or with transmitted forward scattered emitted radiation 2016.

In the back transferred direction (i.e., for radiation 2006, 2018, 2020, 2012 that is reflected from the down conversion material layer), white light may be produced by the combination of back transferred short-wavelength radiation 2006 with either or both of the sub-components 2018, 2020 of the back transferred down-converted radiation 2012. That is, white light may be produced in the back transferred direction by the combination of back transferred short-wavelength light 2006 with reflected emitted radiation 2018 and/or with reflected back scattered emitted radiation 2020.

The wavelength of the forward transferred short-wavelength radiation 2008 may be about the same as the wavelength of the radiation 2000 emitted by a radiation source such as an LED chip 2002. The wavelength of the back transferred short wavelength radiation 2006 may be about the same as the wavelength of the radiation 2000 emitted by the radiation source 2002. The wavelength of the forward transferred short-wavelength radiation 2008 may be about the same as the wavelength of the back transferred short-wavelength radiation 2006. In an exemplary embodiment, the radiation source 2002 may emit radiation exhibiting a wavelength that is less than 550 nm, more particularly in a range of about 200 nm to less than 550 nm. Accordingly, the wavelength of the forward transferred short-wavelength radiation 2008 and the wavelength of the back transferred short-wavelength radiation 2006 may be less than 550 nm, more particularly in a range of about 200 nm to less than 550 nm.

The wavelength of the forward transferred down-converted radiation 2010 (including its sub-components 2014, 2016) and the wavelength of the back transferred down-converted radiation 2012 (including its sub-components 2018, 2020) may be any wavelength that is longer that the excitation spectrum of the down conversion material 2004. In an exemplary embodiment, the excitation spectrum of the down conversion material 2004 may be in the range of about 300 nm to about 550 nm. In alternative embodiments, other down conversion materials may be used that have an excitation spectrum other than in the range of about 300 nm to about 550 nm. The excitation spectrum of the down conversion material 2004 should produce radiation having a wavelength that is longer than the wavelength of the radiation produced by the short-wavelength emitting radiation source 2002. In an exemplary embodiment, the down conversion material 2004 may produce radiation in the range of from about 490 nm to about 750 nm.

To increase the light output from a phosphor-converted white LED (pc-LED) and to achieve higher luminous efficacy, the down-conversion material (e.g., phosphor or quantum dots) is removed to a remote location and a properly tailored optic device is placed between the LED chip and the down-conversion material layer. Then, the back transferred light can be extracted to increase the overall light output and efficacy. This technique significantly increases the overall light output and luminous efficacy of a pc-white LED by extracting the phosphor emitted and back scattered reflected radiation, and the reflected short-wavelength radiation that otherwise would be lost. The invention described in this specification may achieve a 1500-lumen package at 150 lm/W, for example, using an LED chip array. In an exemplary embodiment, the LED chip array may be nitride-based. In alternative embodiment, the LED chip array may be AlInN-based or any other short wavelength emitter.

Figure 1:
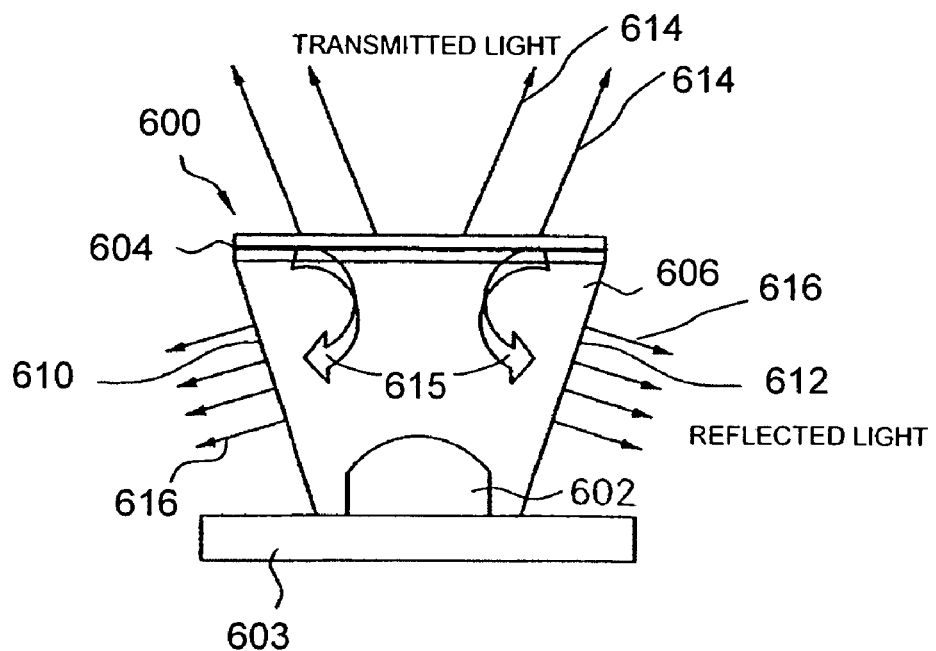
FIG. 1 is a simplified illustration of an optic device.
Figure 2:
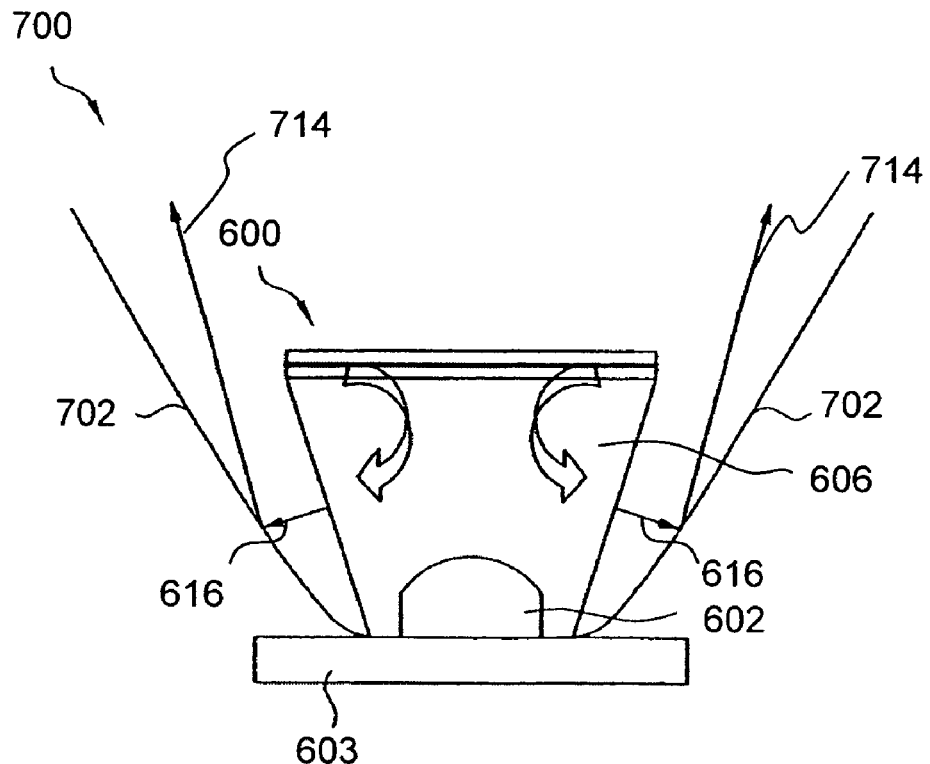
FIG. 2 is another simplified illustration of an optic device with a device to collect light that may be extracted from the optic device.

FIGS. 1 and 2 are simplified illustrations of an optic device to enable a discussion of the general concepts of capturing and extracting back transferred radiation from a down conversion material as may be used in various embodiments of the invention. FIG. 1 illustrates an optic device making use of a down conversion material that is remote from a short wavelength radiation emitter. The down conversion material may be a phosphor. As shown, device 600 includes short wavelength radiation emitter 602 separated from down conversion material (here, a phosphor (or quantum dot) layer) 604 by optic device 606 which may be a transparent medium, such as air, glass, or acrylic, for example. Phosphor (or quantum dot) layer 604 may be mounted or deposited on optic device 606 having walls 610 and 612 that are substantially transparent and light transmissive. Phosphor (or quantum dot) layer 604 may include additional scattering particles (such as micro spheres) to improve mixing of light of different wavelengths. Also the phosphor (or quantum dot) layer 604 may be a single phosphor (or quantum dot) or multiple phosphors (or quantum dots) to produce different colored down-converted radiation that may be in several different spectral regions. Alternatively, a layer with scattering particles only may be placed above, below, or above and below the down conversion material layer to improve color mixing.

Short wavelength radiation emitter 602 may be located between walls 610 and 612. Both the short wavelength radiation emitter 602 and the optic device 606 are positioned on a base 603. Radiation rays 614 may comprise radiation transmitted through the phosphor layer 604 including forward transferred short-wavelength radiation transmitted through the phosphor layer 604 and forward transferred down-converted radiation transmitted through the phosphor layer 604. Radiation rays 615 may comprise back transferred short-wavelength radiation and back transferred down-converted reflected radiation that may be emitted and/or scattered back by phosphor layer 604. Radiation rays 616 may comprise the radiation rays 615 that are transmitted through the substantially transparent light transmissive walls 610 and 612. Accordingly, both radiation rays 615 and radiation rays 616 may include short-wavelength radiation reflected from the phosphor layer 604 and down-converted reflected radiation that may be emitted and/or scattered from the phosphor layer 604. In an exemplary embodiment, some or all of radiation rays 615 and/or 616 may be seen as visible light.

Use of optic device 606 allows the short-wavelength radiation and down-converted radiation that otherwise would be reflected back into the short wavelength radiation emitter 602 to be advantageously transmitted (alternatively referred to as extracted) to the exterior or outside of the optic device 606, through the transmissive properties of the optic device 606.

FIG. 2 illustrates another optic device. As shown, device 700 includes optic device 600 disposed within reflector 702. In FIG. 2, reflector 702 has a geometric shape of a parabola for illustration purposes, but it may take any geometric shape. Substrate 603 may be used for mounting short wavelength radiation emitting source 602, one end of optic device 606, and one end of reflector 702. Light rays 616 that may be transmitted through walls 610 and 612 of optic device 606 may impinge on reflector 702 which redirects them forward as light rays 714. Advantageously, the direction of light rays 714 are desirably generally in the same direction as light rays that have been transmitted through the phosphor layer. Consequently, the total light output of the device 600 may be a combination of light transmitted through the phosphor layer and light rays 714.

Figure 3:
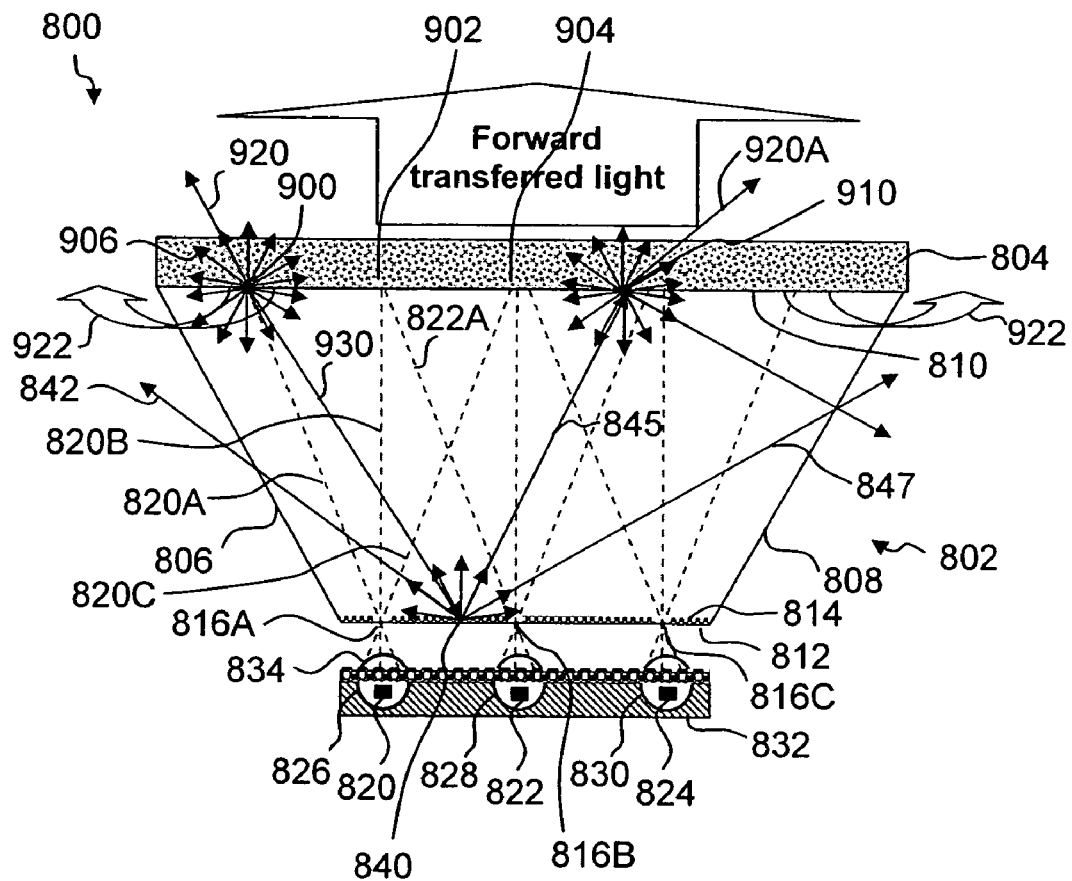
FIG. 3 is partial cross-sectional view of an exemplary embodiment of the present invention.

FIG. 3 illustrates an exemplary embodiment of the present invention. In FIG. 3, device 800 includes optic device 802 which may be a transparent medium such as air, glass, acrylic, or any other medium allowing the transmission of light. Optic device 802 may have substantially transparent light transmissive walls 806 and 808. Optic device 802 may be configured and designed to extract light from inside the optic device 802 to outside the optic device 802. Although optic device 802 is illustrated in FIG. 3 as a four-sided device, it will be understood that optic device may have fewer or more than four sides. It will also be understood that optic device may be in the shape of a cylinder or may have some other round shape.

A down conversion material layer 804 may be mounted, coated, or deposited on portion 810 of optic device 802. In an exemplary embodiment, portion 810 may be an end of optic device 802. In an alternative embodiment, portion 810 may be located at a position other than at an end of optic device 802. A down conversion material is a material that absorbs radiation in one spectral region and emits radiation in another spectral region. In an exemplary embodiment, down conversion material layer 804 may comprise a single down conversion material. In an alternative embodiment, the down conversion material layer 804 may comprise more than one down conversion material. In exemplary or alternative embodiments, the down conversion material layer may comprise one or more phosphors such as YAG:Ce, YAG:ce phosphor plus Eu phosphor; YAG:Ce phosphor plus cadmium-selenide (CdSe) or other types of quantum dots created from other materials including lead (Pb) and silicon (Si); and other phosphors that have been identified in a copending PCT application filed on Jun. 20, 2006. In an alternative embodiment, the phosphor layer may comprise other phosphors, quantum dots, quantum dot crystals, quantum dot nano crystals, or other down conversion material. The down conversion region may be a down conversion crystal instead of powdered material mixed into a binding medium. All of the embodiments disclosed in this application may use any of the phosphors described herein.

Figure 4A:
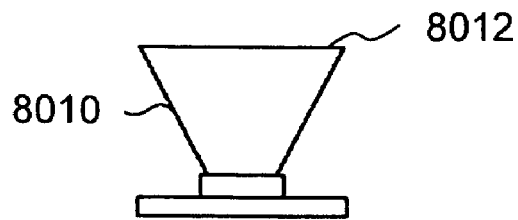
FIGS. 4A-4E illustrate alternative shapes of an optic device that may be used with an exemplary embodiment of the present invention.
Figure 4B:
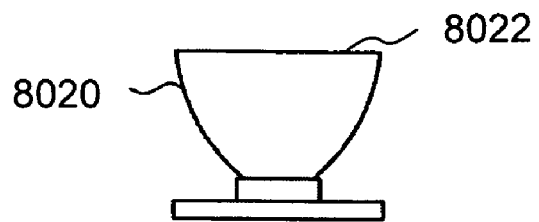
Figure 4C:
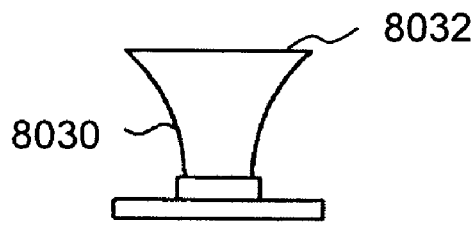
Figure 4D:
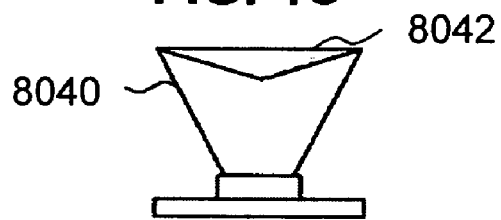
Figure 4E:
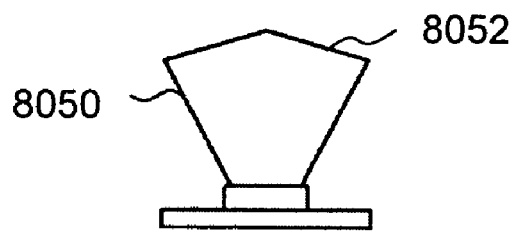

In an exemplary embodiment, end 810 of optic device 802 may be substantially flat. FIGS. 4A-4E depict alternative geometric shapes of optic device 802. Alternative optic device 8010 illustrated in FIG. 4A is of a conical geometry having a top surface 8012. Alternative optic device 8020 illustrated in FIG. 4B is of a spherical geometry having a top surface 8022. Alternative optic device 8030 illustrated in FIG. 4C is of a hyperbolic geometry having a top surface 8032. Alternative optic device 8040 illustrated in FIG. 4D is of a pyramidal geometry having a top surface 8042. Alternative optic device 8050 illustrated in FIG. 4E is of a box-shaped geometry having a top surface 8052. In an exemplary embodiment, and in the alternative embodiments illustrated in FIGS. 4A-4E, top surfaces 810, 8012, 8022, 8032, 8042, and 8052 may be substantially flat, or may have another shape, such as arcuate, for example. The down conversion material may not cover the entire top surface. Instead it may cover only part of the top surface and may cover it in a pattern. The down conversion material may include additional non down converting scattering particles such as microspheres. Alternatively, a layer of scattering particles such as non down converting particles may be placed only above, only below, or both above and below the down conversion material layer to improve color mixing.

Returning to FIG. 3, the transfer (extraction) of radiation through walls 806 and 808 may occur because optic device 802 may be configured and designed with substantially transparent, substantially light transmissive walls 806 and 808 to extract radiation from inside optic device 802 to outside optic device 802. In addition, various dimensions of optic device 802 may be varied in order to extract a desired amount of radiation out of the optic device 802. The dimensions that may be varied are the width at the end 810 and the width at the end 812. Similarly, widths between walls 806 and 808 at one or more points between ends 810 and 812 may be varied. Varying the widths between ends 810 and 812 may result in walls 806 and 808 being substantially straight, curved, or having both straight and curved portions.

The dimensions and shapes of the features of the optic device 802 discussed above may be varied depending upon the application to which the optic device 802 may be used. The dimensions of the features of optic device 802 may be varied, and set, by using the principles of ray tracing and the principles of total internal reflection (TIR). When principles of TIR are applied, reflectivity of radiation off of one or both walls 806 and 808 may exceed 99.9%. The principles of TIR may be applied to all of the embodiments disclosed in this application and their application is discussed again below.

As shown in FIG. 3, an exemplary embodiment of the device 800 may have three short-wavelength radiation emitters (called light sources hereafter) 820, 822, 824 positioned adjacent portion 812 of optic device 802. In an exemplary embodiment, portion 812 may be located at an end of optic device 802 and may be opposite end 810. In an alternative embodiment, portion 812 may be located at a position other than at an end of optic device 802. Light sources 820, 822, 824 may each be a semiconductor light emitting diode such as a light emitting diode (LED), a laser diode (LD), or a resonant cavity light emitting diode (RCLED). In an exemplary embodiment, some or all of the light sources may transmit short-wavelength radiation toward down conversion material 804 in order to create white light. Although FIG. 3 shows three light sources, it will be understood that fewer or more light sources may be used.

As shown in FIG. 3, light sources 820, 822, and 824 may all positioned outside of end 812 of optic device 802. Light sources 820, 822, and 824 may be positioned inside respective reflectors 826, 828, and 830 which may also be positioned outside of end 812. The reflectors 826, 828, and 830 may direct at least some of the short wavelength radiation emitted from the light sources 820, 822, and 824 into the optic device 802. In an exemplary embodiment, reflectors 826, 828, and 830 may exhibit a concave geometric shape. In alternative embodiments, reflectors 826, 828, and 830 may exhibit a parabolic shape, an elliptical shape, or a flat shape. If an embodiment of the reflectors exhibits a flat geometric shape, an epoxy may be placed around each of the light sources to hold them in place. The reflectors 826, 828, and 830, with the respective light sources 820, 822, and 824, may be mounted into a base 832. A micro lens 834 may be disposed above reflectors 826, 828 and 830 and between the light sources and end 812. In exemplary embodiment, micro lens 834 may be placed across the top of base 832. Micro lens 834 may be in the form of a sheet of individual elements. Micro lens 834 may be a portion of the device that directs at least some of the light from light sources 820, 822, 824 into optic device 802. Micro lens 834 may be disposed between the light sources and the optic device. The purpose of micro lens 834 may be to focus radiation from light sources 820, 822, 824 through apertures 816A, 816B, and 816C, discussed in more detail below. If the reflectors 826, 828, 830 focus a sufficient amount of radiation into respective apertures, then micro lens 834 may not be needed.

Although FIG. 3 illustrates three light sources and three reflectors, an alternative embodiment of the invention may have nine light sources and nine reflectors, for example. The light sources may all be the same size or they may be different sizes, depending on the quantity of light output that is desired. The light sources may be arranged in a variety of configurations, such a circular, oval, or linear. Other numbers of light sources and reflectors may be used. For example, an array of 3×24 light sources and reflectors may be used.

If the light sources are laser diodes (LD), the light beam may be collimated and, instead of a micro lens 834, a graded index (GRIN) lens, ball lens, or any other lens may be placed between the light sources and the optic device to direct the short wavelength radiation transmitted by the laser diodes in a desired direction. If the light sources are LEDs, a parabolic or elliptical reflector may be used along with a lens to direct the light. Alternatively, LEDs may be used with a reflector alone, without a lens, in which case the reflector may direct the light in a desired direction. In any of these embodiments, a lens may be used to better direct the radiation, thereby increasing coupling capacity. However, if cost is a consideration, the lens may be eliminated. Any of the referenced micro lens, GRIN lens, ball lens, or other lens, and reflectors may be referred to as a device for directing short wavelength radiation emitted from a radiation source into the optic device. The source for emitting short wavelength radiation may also be referred to as a short wavelength radiation emitter.

Figure 5:
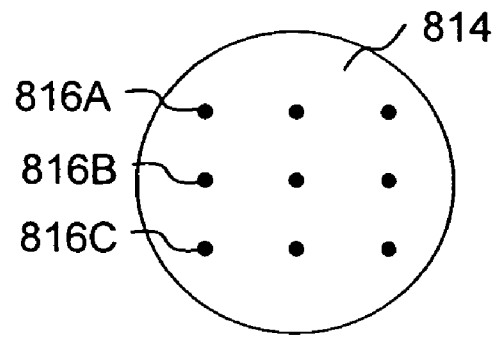
FIG. 5 illustrates an exemplary embodiment of apertures that may be disposed in an exemplary embodiment of the present invention.
Figure 6:
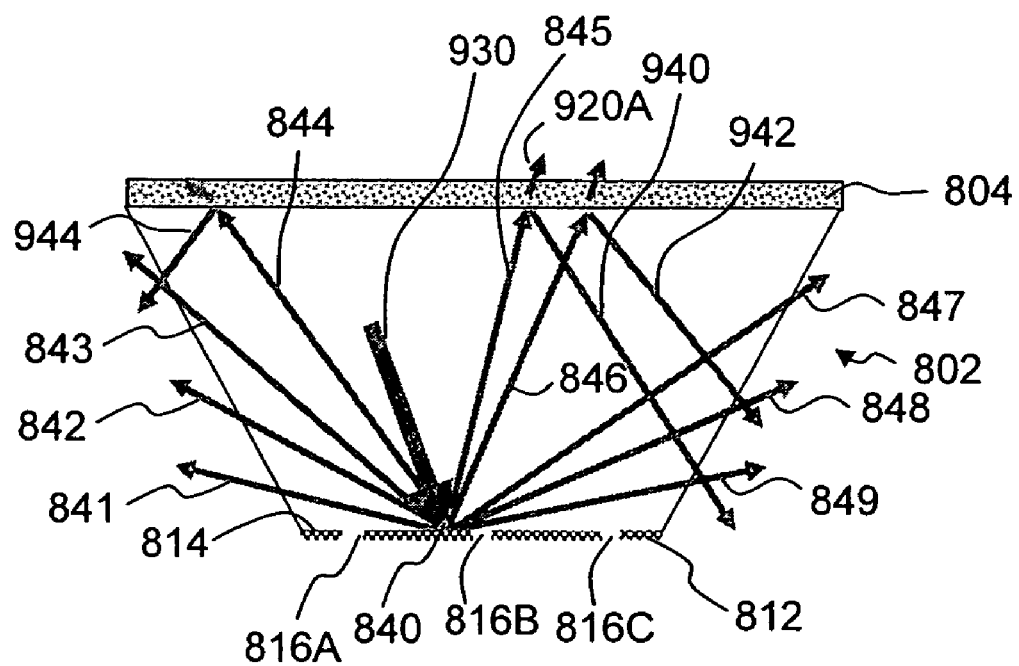
FIG. 6 illustrates exemplary effects of an exemplary light ray inside an optic device in accordance with an exemplary embodiment of the present invention.

As shown in FIGS. 3, 5 and 6, end 812 of optic device 802 may have an inside surface 814. In an exemplary embodiment, inside surface 814 of end 812 may be a reflective white surface having a reflectivity of about 70% or higher. In an alternative embodiment, the reflective surface may be other than white and may have a reflectivity other than 70%. In an exemplary embodiment, inside surface 814 may be part of the optic device 802. In an alternative embodiment, a reflective plate may be placed on top of the inside surface of end 812. If a reflective plate is used, it may be made of any material that provides a reflective surface or that would support a reflective surface. Regardless of how the reflective surface is formed or applied, the reflective surface may have a smooth surface, it may have bumps on its surface, conical sections on its surface, or any other finish on the surface that may enhance the reflectivity of the inside surface.

End 812 may have a plurality of very small apertures in it. FIGS. 3 and 6 illustrate three apertures, 816A, 816B, and 816C. The apertures 816A, 816B, and 816C may be configured to allow at least some of the radiation from the light sources 820, 822, 824 to be transferred into the optic device. In an exemplary embodiment, a diameter of the apertures may be selected from a range of about 0.2 mm to about 1 mm. In alternative embodiments, the diameters of the apertures 816A, 816B, and 816C may be selected from a range of about 1 mm to about 3 mm. The diameters of the apertures may be selected to be sufficiently small in order to minimize the amount of back transferred radiation from phosphor layer 804 that may escape through the apertures 816A, 816B, and 816C. Also if a reflective plate is used, there may be a number of apertures or, alternatively, transparent areas in the reflective plate. The number of apertures or transparent areas may desirably equal the number of light sources. FIG. 5 illustrates the apertures as black dots, solely for illustrative purposes in order to distinguish the apertures from the white paper. FIG. 5 also illustrates an exemplary embodiment having an array of nine apertures. It will be understood that more or fewer apertures may be used than what is illustrated in FIGS. 3, 5, and 6. As mentioned above, the number of apertures may desirably equal the number of light sources.

Respective apertures may be aligned with respective light sources so that at least some of the radiation emitted from each light source may be transferred through a respective aperture into the optic device. In an alternative embodiment, very small transparent areas may be provided in end 812 and in the inside reflective surface 814 instead of apertures. The diameter of the alternative embodiment transparent areas may be the same as the diameter of the apertures in the exemplary embodiment. Again, the number of transparent areas may desirably equal the number of light sources. Inside surface 814 may be highly reflective over its entire surface except at the locations where light from the light sources may enter optic device 802 through the apertures or transparent areas.

The apertures (or alternative transparent areas), such as apertures 816A, 816B, and 816C, may be aligned with the light sources 820, 822, and 824 so that respective devices for directing the radiation may direct the radiation from the light sources into optic device 802 through the respective apertures or, alternatively, through the respective transparent areas. For illustration purposes, we will describe the operation and effect of radiation emitted from light source 820. It will be understood that the operation and effect of radiation emitted from light sources 822 and 824, and from any additional light sources may be the same as the operation and effect of radiation emitted from light source 820.

Referring, for illustration purposes, to light source 820, exemplary radiation rays 820A, 820B, and 820C may be transmitted from light source 820 through aperture 816A and may impinge on phosphor layer 804 at exemplary impingement points 900, 902, and 904. It will be understood by those skilled in the art, that more or fewer radiation rays may be transmitted by light source 820 and may impinge on phosphor layer 804 in more or fewer than three points.

Arrow cluster 906 illustrates the various radiation components that may be created when exemplary radiation ray 820A impinges on phosphor layer 804 at exemplary impingement point 900: back transferred short-wavelength radiation reflected from the down conversion material layer; forward transferred short-wavelength radiation transmitted through the down conversion material layer; reflected down-converted radiation emitted and/or scattered from the down conversion material layer; and down-converted radiation emitted and/or scattered transmitted through the phosphor layer. It will be understood that similar radiation components may be created at every point where exemplary radiation ray 820A impinges on phosphor layer 804. It will also be understood that light sources 822 and 824 may also emit radiation rays that impinge upon phosphor layer 804, generating the same four radiation components at their respective points of impingement.

Radiation rays from light sources other than light source 820 may impinge upon phosphor layer 804 at some of the same points where radiation from light source 820 impinges on phosphor 820. Radiation rays from light sources other than light source 820 may impinge on phosphor layer 804 at points that are different from the points on phosphor layer 804 where radiation from light source 820 impinges. For example, exemplary light ray 822A from light source 822 may impinge on phosphor layer 804 at exemplary impingement point 902. Consequently, exemplary impingement point 902 may be impacted by radiation from light source 820 and from light source 822. It will be understood that if more than three light sources are used, exemplary impingement point 902 may also be impacted by radiation from light sources in addition to the light sources illustrated in FIG. 3. It will also be understood that if more than three light sources are used, each of those additional light sources may also cause radiation rays that impinge upon phosphor layer 804 at multiple impingement points creating more or fewer than the same types of radiation components at their respective points of impingement on phosphor layer 804. Each point of impingement may be impacted by radiation from one light source or by radiation from more than one of the light sources.

As indicated above, the two radiation components that may be transferred through the phosphor, i.e., the forward transferred radiation, may result in the forward transmission of white light 920. As illustrated by exemplary arrows 922 in FIG. 3, some of the reflected radiation that may be emitted and/or scattered by phosphor layer 804 may be transferred out of the optic device 802 through its side walls 806 and 808. Although exemplary arrows 922 show back transferred radiation being transferred at the top of side walls 806 and 808 of optic device 802, it will be understood that back transferred radiation may be transferred through side walls 806 and 808 at multiple locations along the side walls. This transfer of radiation through the side walls may occur because optic device 802 may be configured and designed with substantially transparent light transmissive walls to extract radiation from inside the optic device to outside the optic device. The height of optic device 802 may be configured by adjusting the distance between end 810 and end 812 to extract a desired amount of radiation out of the optic device. In addition, various widths of optic device 802 may be varied in order to extract a desired amount of radiation out of the optic device 802. The widths that may be varied are the width at the end 810 and the width at the end 812. Similarly, widths between ends 810 and 812 may be varied. The widths between ends 810 and 812 may result in walls 806, 808 being substantially straight, curved, or having both straight and curved portions.

Some of the back transferred radiation from phosphor layer 804 may not be transferred out of optic device 802 through its side walls 806 and 808. Some of the back transferred radiation may be reflected toward inside reflective surface 814 and may impinge on reflective surface 814. For example, exemplary radiation ray 930 shown in FIGS. 3 and 6 may impact inside surface 814 at exemplary impact point 840. It will be understood that exemplary radiation ray 930 is shown for illustration purposes. Other radiation rays may impact inside surface 814 at exemplary impact point 840 from other reflecting impact points on phosphor 804. Also, other radiation rays from exemplary impingement point 900 may impact other points on inside surface 814. Other radiation rays from other impact points on phosphor 804 may impact a plurality of points on inside surface 814.

An exemplary effect of exemplary radiation ray 930 impinging exemplary impact point 840 is illustrated in FIGS. 3 and 6. Radiation impinging impact point 840 may be reflected from impact point 840 in a plurality of directions. Exemplary radiation rays reflected from impact point 840 are illustrated in FIGS. 3 and 6. It will be understood that more or fewer radiation rays may be reflected from impact point 840. Exemplary radiation rays 841, 842, 843, 847, 848, and 849 may be reflected out of optic device 802. Exemplary radiation rays 844, 845 and 846 may be reflected toward phosphor layer 804. It will be understood that more or fewer radiation rays may be reflected from impact point 840 on inside surface 814. Referring to FIG. 3, exemplary reflective ray 845 may impinge on phosphor layer 804 at exemplary impingement point 910 generating radiation having the four radiation components discussed above. Some of the radiation impacting phosphor layer 804 at exemplary impingement point 910 may be transmitted through the phosphor layer as white light illustrated by exemplary arrow 920A. Some of the radiation may be reflected out of optic device 802 as illustrated by exemplary arrow 940 in FIG. 6. Other radiation that may be reflected is illustrated by exemplary arrows 942 and 944. Although not illustrated in FIGS. 3 and 6, some of the radiation back transferred by the phosphor at exemplary impact point 910 may impact inside surface 814 resulting in another reflection from inside surface 814.

In operation, short wavelength radiation from exemplary light sources 820, 822, 824 may be transmitted into optic device 802 through aligned apertures 816A, 816B, 816C. The short-wavelength radiation transmitted into optic device 802 may impact phosphor layer 804 (or other down conversion material). When the short-wavelength radiation impacts phosphor layer 804, some of the radiation may be forward transferred through the phosphor layer as white light and some of the radiation may be back transferred from the phosphor layer. Some of the back transferred radiation may be transferred out of optic device 802 through walls 806, 808. Some of the back transferred radiation may be transferred toward reflective inside surface 814 of end 812. When back transferred radiation from phosphor layer 804 impinges on inside surface 814, inside surface 814 may, in turn, reflect some of the radiation out of optic device 802 through walls 806, 808 and may transfer some of the radiation back toward phosphor layer 804. When radiation reflected from inside surface 814 impinges on phosphor layer 804, the impinging radiation may form new forward transferred radiation and new back transferred radiation. Continued reflections by the phosphor layer and reflections by inside layer 814 may subject the radiation to multiple bounces back and forth between the phosphor layer 804 and the reflective surface 814 so that a substantial amount of the radiation transferred from the plurality of light sources into the optic device may be transferred out of the optic device, rather than being reabsorbed by the light sources or by any adjacent surface or object (reflector, micro lens, GRIN lens, wire bonds, etc.)

The dimensions of optic device 802 may be set in order to maximize the amount of the radiation from the light sources 820, 822, 824 that enters into optic device 802. In an alternative embodiment, the dimensions of optic device 802 may be set in order to maximize the amount of radiation from light sources 820, 822, 824 that impinges upon down conversion material 804. In another alternative embodiment, the dimensions of optic device 802 may be set in order to maximize the amount of radiation that is back transferred from down conversion material 804. In yet another alternative embodiment, the dimensions of optic device 802 may be set in order to provide a device that, to the extent possible, simultaneously maximizes each of the radiation features discussed above: the amount of radiation entering into optic device 802; the amount of radiation that impinges upon down conversion material 804; the amount of radiation that is back transferred from down conversion material 804; and the amount of radiation that is extracted from optic device 802 through walls 806 and 808. In still another embodiment, the dimensions of optic device 802 may be set so that any or all of the features discussed above are not maximized. The principles of ray tracing and TIR may be used in order to implement any of these embodiments.

Any and all principles discussed with respect to the embodiment illustrated in FIG. 3 may also be applied to all of the embodiments illustrated and discussed herein.

After radiation enters into the optic device any embodiment of this invention, one of the objectives of all of the embodiments of this invention may be to limit the amount of radiation that leaves the optic device through the apertures. FIG. 13A to FIG. 13D and FIG. 14 provide examples of alternative embodiments of the optic device illustrated in FIG. 3 and how embodiments may be designed to vary the amount of radiation that leaves the optic device through the apertures.

Figure 13A:
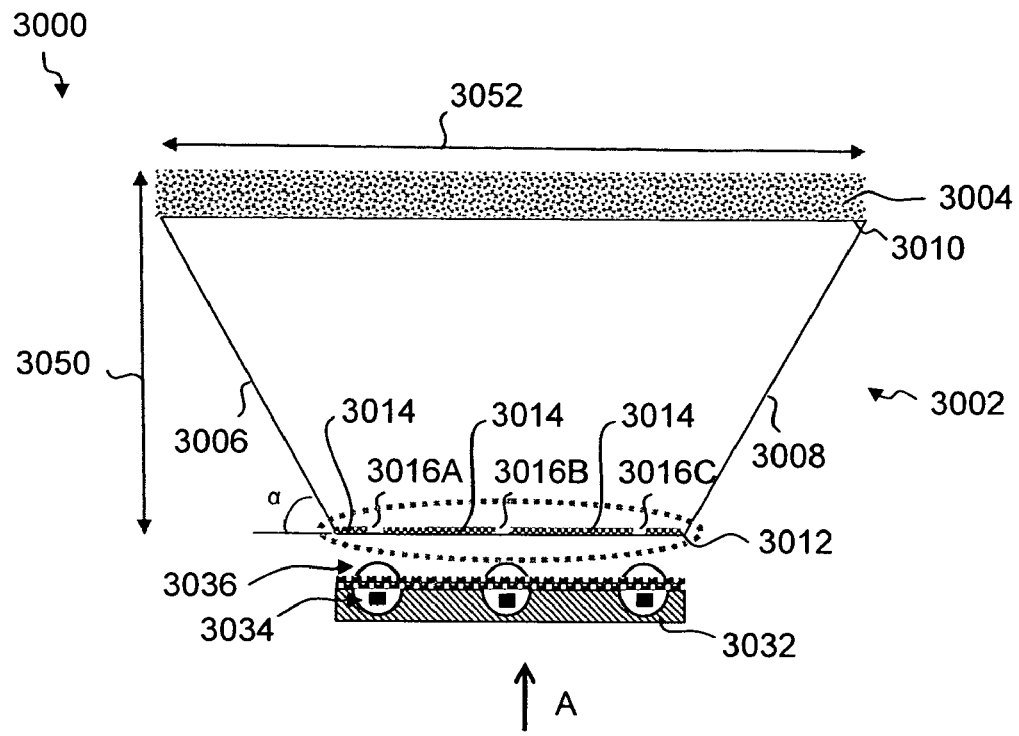
FIG. 13A is a partial cross-section view and a partial perspective view of another embodiment of the present invention.

Referring to FIG. 13A, a partial cross-section of a device 3000 is shown, as well as a partial perspective view of it. Device 3000 has an optic device 3002 having side walls 3006 and 3008 and may have a down conversion material 3004 disposed on an end 3010 of the optic device 3002. To the extent that device 3000 and optic device 3002 are illustrated as having certain specific features, it will be understood that these features may be varied and that other embodiments may be designed in accordance with any or all of the variations discussed above with respect to FIG. 3 or in accordance with any or all of the variations discussed with respect to any and all other embodiments disclosed herein. It will also be understood that the embodiments described in accordance with FIG. 13A may function in the same way as embodiments described in accordance with FIG. 3.

Figure 13B:
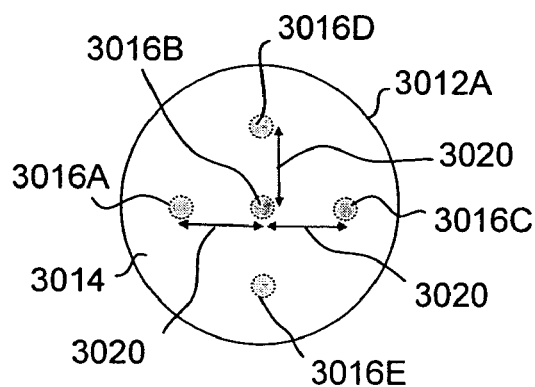
FIG. 13B is a bottom view of an end of the embodiment shown in FIG. 13A.

Optic device 3002 may have another end 3012 that may be opposite to end 3010. FIG. 13A shows end 3010 in a partial cross-section view and also shows end 3012 as a partial perspective view. FIG. 13B is a bottom view of end 3012 in the direction of arrow A in FIG. 13A. Both the partial perspective view of end 3012 (shown as end 3012A in FIG. 13A) and the bottom view of end 3012A shown in FIG. 13B show that the end designated by reference numbers 3012 and 3012A may be circular.

Device 3000 may include a base 3032 having a plurality of light sources generally designated by reference number 3034 and a plurality of reflectors generally designated by reference number 3036 which may hold respective ones of the light sources 3034. Referring to FIGS. 13A and 13B, inside surface 3014 of end 3012A may be a reflective surface and may have a plurality of apertures or transparent areas 3016A, 3016B, 3016C, 3016D, and 3016E. For ease of illustration, only apertures 3016A, 3016B, and 3016C are illustrated in FIG. 13A. Although apertures 3016A, 3016B, 3016C, 3016D, and 3016E are shown as circular, one or more of them may have a different shape. In other embodiments, more or fewer apertures may be used. Although only three light sources and three reflectors are shown in FIG. 13A, it will be understood that the number of light sources may equal the number of apertures. It will also be understood that the number of light sources, the number of reflectors, and the number of apertures may be fewer or more than five.

Figure 13C:
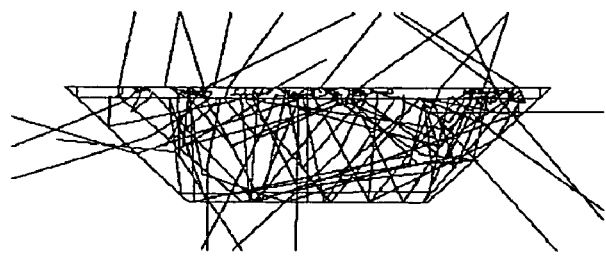
FIG. 13C illustrates a ray tracing simulation of the embodiment shown in FIG. 13A.

In the exemplary embodiment illustrated in FIG. 13A, the height 3050 of optic device 3008 is about 10 mm; the diameter 3052 of end 3010 is about 41 mm; the diameter of end 3012 is about 21 mm; the angle α between end 3012 and side walls 3006 and 3008 is about 45°; the distance between the centers of each aperture is about 7 mm; and the inside surface of end 3012A is about 95% reflective. The exemplary embodiment illustrated in FIG. 13A, having five light sources, five reflectors, and five apertures is also illustrated in FIG. 13C, showing a ray tracing simulation.

Figure 13D:
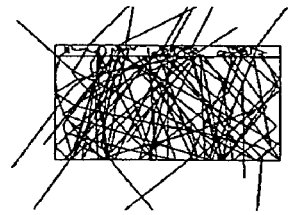
FIG. 13D illustrates a ray tracing simulation for an embodiment that is different from the embodiment shown in FIG. 13A.

FIG. 13D illustrates another ray tracing simulation for a different embodiment. The embodiment illustrated in FIG. 13D is the same as the embodiment illustrated in FIG. 13C except that angle α is about 90° and the diameter of end 3010 is the same as the diameter of end 3012A: about 10 mm.

Figure 14:
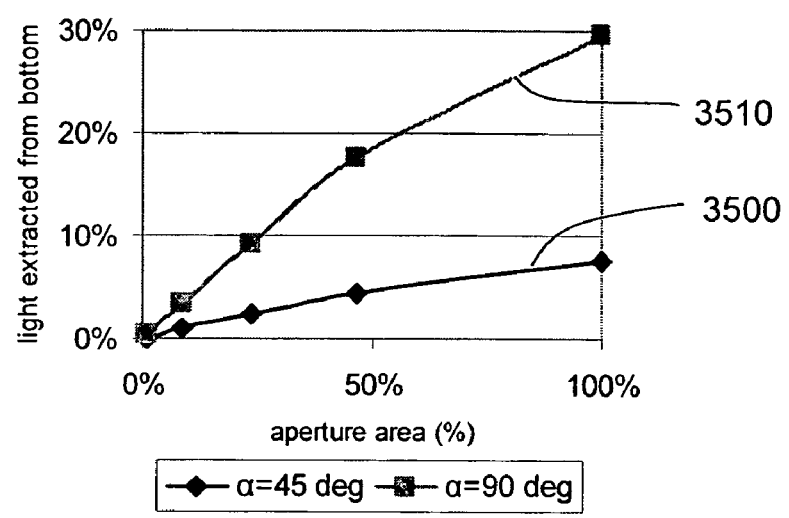
FIG. 14 is a graph showing how much light may be extracted from the bottom of an optic device under varying conditions.

FIG. 14 is a graph that shows how much light is extracted (exits) from the bottom of optic 3002 under varying conditions. The vertical axis of FIG. 14 is a measure of how much light is extracted from the end 3012A of optic device 3002 as a percentage of the light that is back transferred from down conversion material 3004. The horizontal axis is a measure of the percentage of end 3012A that is taken up by the apertures in end 3012A of optic device 3002. Accordingly, the left end of the horizontal axis shows that the apertures are about 0% of the area of end 3012A. The right end of the horizontal axis shows that the apertures are about 100% of the area of end 3012A. In other words, about 100% indicates that end 3012A is completely transparent. The diameter of each aperture is enlarged or decreased in order to vary the percentage of the area of end 3012A that is comprised by the apertures. Line 3500 in FIG. 14 is a graph for the optic device illustrated in FIG. 13C; that is, when angle α is about 45°. Line 3510 in FIG. 14 is a graph for the optic device illustrated in FIG. 13D; that is, when angle α is about 90°. For both lines, the diameter of end 3012A was maintained at 21 mm and the height 3050 of optic device 3002 was maintained at about 10 mm.

Referring again to FIG. 14, line 3500 illustrates, for example, that approximately 5% of back transferred light is extracted from the end 3012A of optic device 3002 for an optic device having an angle α equal to about 45° when the apertures 3016A-3016E comprise approximately 50% of the area of end 3012A. Still referring to FIG. 14, line 3510 illustrates, for example, that approximately 19% of back transferred light is extracted from end 3012A for an optic device has an angle α equal to about 90° when the apertures 3016A-3016E comprise approximately 50% of the area of end 3012A. For both lines of the graph in FIG. 14, it will be understood that each line shows different amounts of extraction for different percentages of aperture area.

In an exemplary embodiment, the total area of all apertures 3016A-3016E in end 3012A may be approximately 5% of the total area of end 3012A. For the embodiment illustrated in FIG. 13C, line 3500 in FIG. 14 shows that approximately 1.0% of the back transferred light may be extracted from end 3012A when the total aperture area is approximately 5% of the total area of end 3012A. For the embodiment illustrated in FIG. 13D, line 3510 in FIG. 14 shows that approximately 2.5% of the back transferred light may be extracted from end 3012A when the total aperture area is approximately 5% of the total area of end 3012A. In an exemplary embodiment, it may be preferable to limit the amount of light that is extracted from end 3012A because such extracted light may not be usable to create usable light and because it may impinge on one or more of the light sources 3034, thereby possibly degrading the light sources 3034. Accordingly, FIG. 14 shows that the percentage of light that may be extracted from end 3012A of optic device 3002 may vary, depending on the size of angle α, the height of optic device 3002, the diameter of each aperture and other factors.

It will be understood that the examples of embodiments illustrated in FIGS. 13A-13D and 14 are non-limiting examples. Other embodiments may have heights, diameters, angles, numbers of apertures, aperture diameters, distances between apertures that are the same as, or different from, these non-limiting examples.

In addition, the embodiments illustrated in FIGS. 13A-13D, or the embodiments illustrated elsewhere in this application, may have different kinds of apertures. For example, one or more apertures may be created as interference filters that may only allow radiation from light sources 3034 to go through the apertures 3016A-3016E into optic device 3002 but prevent back transferred radiation from exiting through the apertures. Examples of such filters are Bragg filters and Fabry-Perot filters. One or more of the apertures 3016A-3016E may use either a Bragg filter or a Fabry-Perot filter. In an exemplary embodiment, respective filters may be placed inside one or more of apertures 3016A-3016E. In an alternative embodiment, one or more of apertures 3016A-3016E themselves may be a filter and therefore may be part of the optic device 3002 itself. Such filters may allow only radiation having a specific wavelength to pass through respective apertures and may not allow any back transferred radiation to pass back through them toward the light sources 3034. For example, in one embodiment, one or more of such filters may allow blue light from LEDs to pass through one or more of the apertures 3016A-3016E into optic device 3002, but may prevent back transferred yellow back transferred light from passing through one or more of the apertures 3016A-3016E and impinging upon light sources 3034.

One or more of the apertures 3016A-3016E may also be created as a microlens by using an etching process or an ultraviolet (UV) radiation process. In such embodiments, when radiation from light sources 3034 impinge on the surface of microlenses in one or more of the apertures 3016A-3016E, the apertures may act as a lens, rather than being a pure aperture. In yet another alternative embodiment, only a percentage of one or more apertures may be formed as a lens. For example, a half-lens may be formed in one or more of the apertures to create a shaped beam. For any of these embodiments, one or more of the lenses may have respective ones of a flat shape, a concave shape, a convex shape, or other shapes that may have different angular shapes, or may be shaped in a pattern. For example, one or more lenses may have angular sides or angular components.

Figure 7:
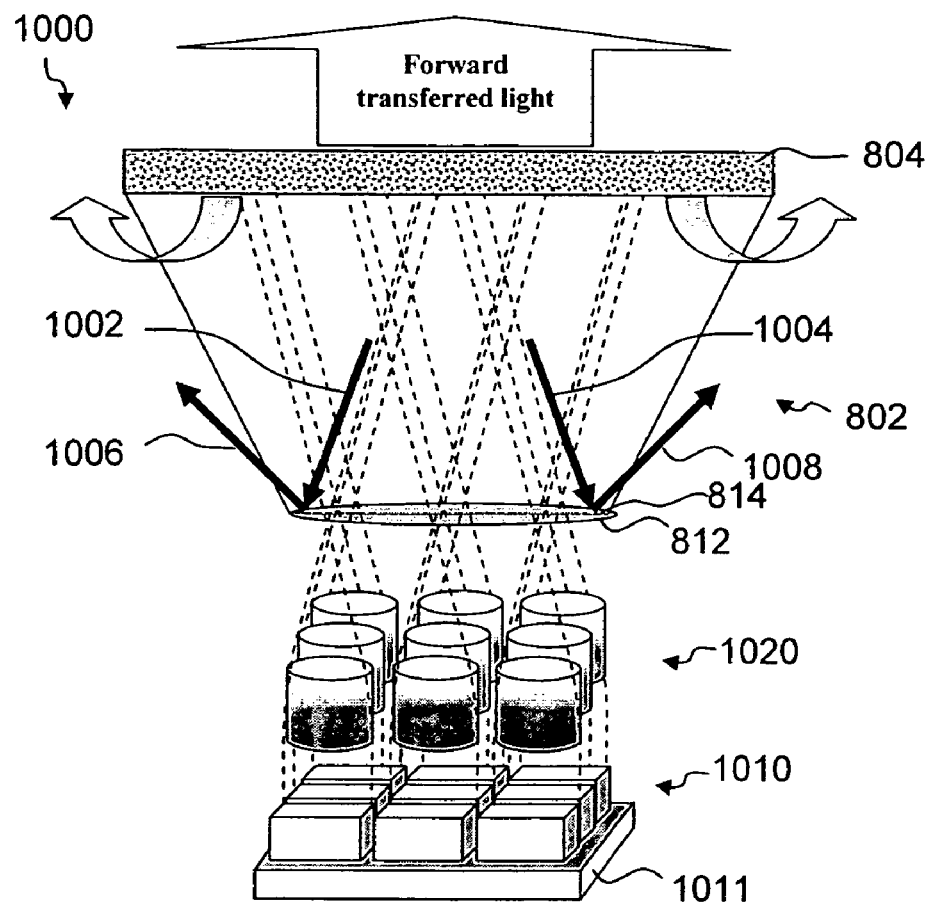
FIG. 7 is an exploded view of an alternative embodiment of the present invention.

FIG. 7 is a partially exploded view of an alternative embodiment of the present invention. FIG. 7 shows device 1000 with optic device 802 having a phosphor layer 804 at one end and an inside reflective surface 814 at end 812. Although not shown in FIG. 7, there may be apertures or transparent areas in reflective surface 814. In a manner that is similar to the embodiment illustrated in FIGS. 3-6, short-wavelength radiation entering optic device through end 812 may bounce back and forth between phosphor layer 804 and reflective surface 814.

The embodiment illustrated in FIG. 7 shows an exemplary array of light sources 1010 positioned outside optic device 802 and mounted on a substrate 1011. FIG. 7 also shows an exemplary array of lenses 1020 also disposed outside optic device 802 and positioned between the light source array 1010 and optic device 802. The number of lenses desirably equals the number of light sources. Respective lenses in lens array 1020 may be aligned with respective light sources 1010 and with respective apertures or transparent areas in reflective surface 814. Short wavelength radiation from respective one of the light sources 1010 may be directed into optic 802 by respective aligned lenses in lens array 1020 and through respective aligned apertures in end 812. Alternative embodiments of device 1000 may include more or fewer light sources and lenses, and alternative embodiments of the lenses and light sources may comprise the alternatives discussed above with respect to the embodiment disclosed in FIGS. 3-6. FIG. 7 also illustrates exemplary radiation rays 1002 and 1004 that may be back transferred from phosphor layer 802 and may impinge on reflective surface 814. FIG. 7 also illustrates an exemplary radiation ray 1006 that may be reflected from reflective surface 814 out of optic device 802 responsive to radiation ray 1002 impinging on reflective surface 814 and an exemplary radiation ray 1008 that may be reflected from reflective surface 814 out of optic device 802 responsive to radiation ray 1004 impinging on reflective surface 814.

Figure 8:
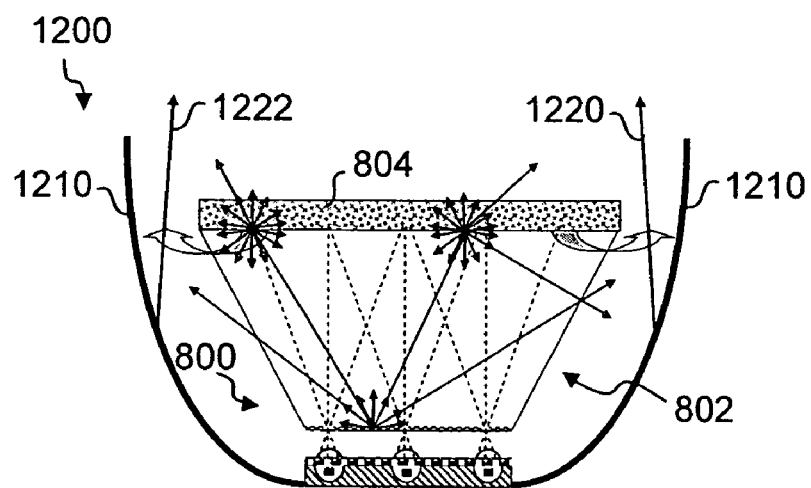
FIG. 8 is a partial cross-section view of another alternative embodiment of the present invention.

FIG. 8 illustrates another embodiment of the invention. As shown, device 1200 includes device 800 disposed within a light reflector 1210. Reflector 1210 has a geometric shape of a parabola. Reflector 1210 may have other geometrical shapes such as a cone, a sphere, a hyperbola, an ellipse, or may be box-shaped, for example. Reflector 1210 is disposed around at least a portion of optic device 802. The advantages of device 1200 may include better control of the beam output distribution and better uniform output of the radiation. In addition, reflector 1210 may collect substantially all of the radiation that leaves optic device 802 and direct it forward in the direction of phosphor layer 804, but without impinging on phosphor layer 804. The radiation that impacts reflector 1210 may be light that is extracted from optic device 802. The radiation may be extracted from optic device 802 because of its configuration and its design, discussed above, including substantially transparent light transmissive walls. The extracted light may include back transferred radiation from the down conversion material, short-wavelength radiation from the light sources in array 1010, and radiation reflected within the optic device 802. It will be understood that the light extracted by other embodiments of the invention may also include the short-wavelength radiation from their respective light sources. The reflected radiation within the optic device may include radiation that bounces one time off of the reflective surface inside the end of the optic device in addition to radiation that may bounce back and forth between the down conversion material 804 and the reflective surface.

Exemplary rays of radiation reflected by reflector 1210 are illustrated as exemplary radiation rays 1220 and 1222. It will be understood that reflector 1210 may reflect less or more radiation than is represented by exemplary radiation rays 1220 and 1222. When reflector 1210 is used, radiation forward transferred through phosphor layer 804 may be combined with radiation reflected by reflector 1210 thereby providing an efficient light source that captures a substantial amount of the short wavelength radiation emitted by the light sources and may direct the captured light in a substantially single direction.

Figure 9:
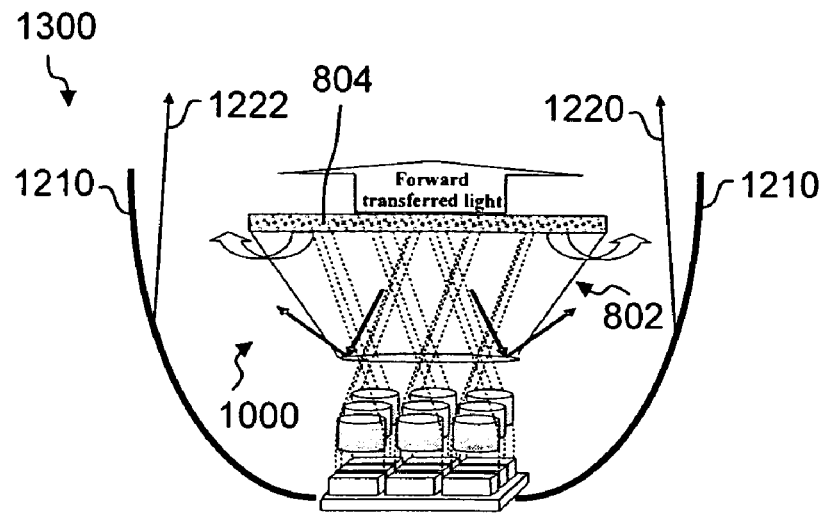
FIG. 9 is a exploded view of yet another alternative embodiment of the present invention.

FIG. 9 illustrates another embodiment of the invention. As shown, device 1300 includes device 1000, discussed above in reference to FIG. 7, disposed within a light collector including reflector 1210 which may have the same shapes as were described with respect to FIG. 8. Reflector 1210 may provide the same advantages to device 1300 as provided when reflector 1210 is used with device 1200.

Figure 10:
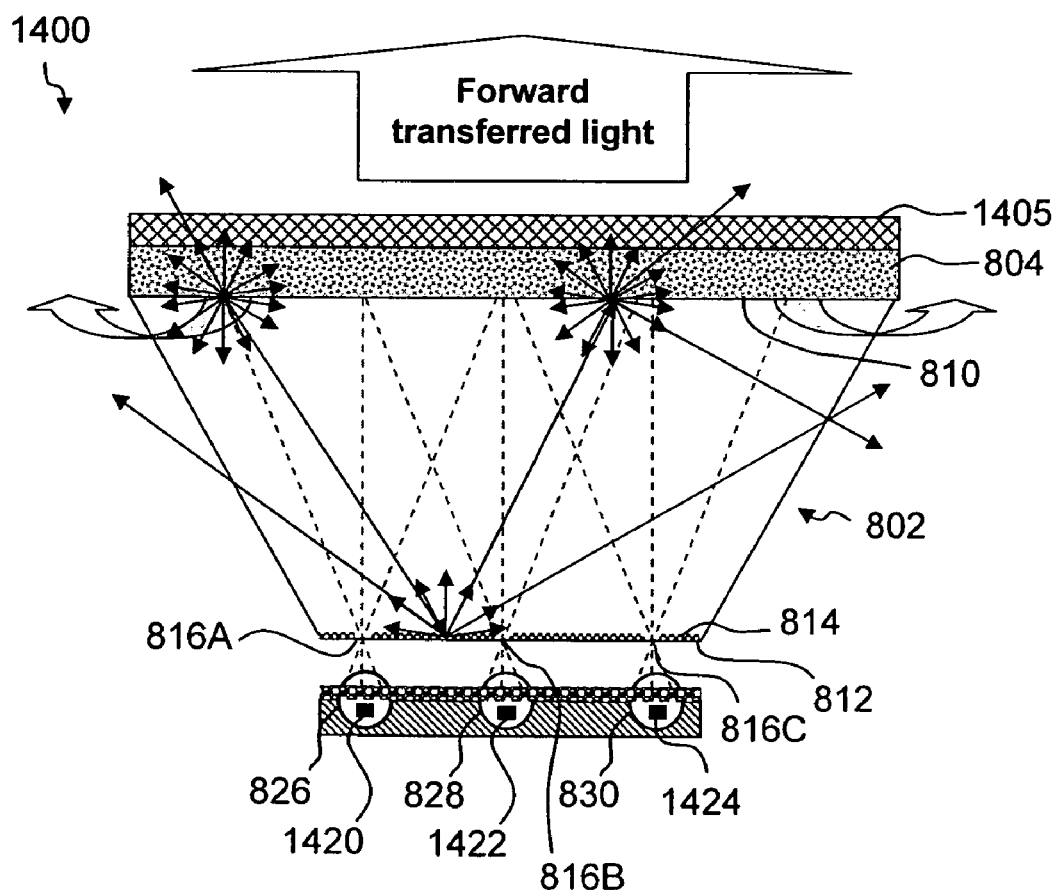
FIG. 10 is a partial cross-section view of another embodiment of the present invention.

FIG. 10 illustrates another embodiment of the invention illustrated in FIG. 3. The description of the embodiment illustrated in FIG. 3 is incorporated by reference. More particularly, the embodiment illustrated in FIG. 10 illustrates a device 1400 that has an optic device 802 with end portions 810, 812, reflective inside surface 814, and apertures or transparent areas 816A, 816B, and 816C. Light sources 1420, 1422, 1424 may be positioned adjacent end portion 812 inside reflectors 826, 828, 830. Respective light sources 1420, 1422, and 1424 may be aligned with respective ones of the apertures or transparent areas 816A, 816B, and 816C. A lens, or a plurality of lenses may be positioned between the light sources 1420, 1422, and 1424 and the apertures or transparent areas 816A, 816B, and 816C. A down conversion material 804 may be positioned on end portion 810 of optic device 802. The down conversion material 804 may be a phosphor.

In this embodiment, the light emitting sources 1420, 1422, 1424 may be multiple colored light emitting sources. That is, each of the light emitting sources 1420, 1422, 1424 may exhibit a spectrum that is different than a spectrum of the other light emitting sources. As a result, in an exemplary embodiment of the embodiment illustrated in FIG. 10, individual ones of the light emitting sources 1420, 1422, 1424 may exhibit one or more of the colors red, green, and blue. For example, one of the light emitting sources may emit red light, a second light emitting source may emit green light, and the third light emitting source may emit blue light. That is, each of the light emitting sources may produce its own respective narrow band of radiation, or may produce both narrow bands and wide bands of radiation. In an alternative embodiment, one or more of the light emitting sources may display a color other than red, green, or blue. Although FIG. 10 illustrates three light emitting sources, alternative embodiments may use fewer or more light emitting sources.

The colors that may be displayed by the light emitting sources may depend upon the use to which the device is put. In some embodiments, multiple colors may be used. In other embodiments, only two colors may be used. In yet other embodiments, more than one light emitting source may emit a particular color. All of the embodiments of the device may mix multiple spectra to create white light or may create various shades of colors with uniform illumination and color without reducing the overall luminous efficiency.

Even if the multiple colored light emitting sources 1420, 1422, 1424 are capable of emitting a plurality of colors, all of the colors need not be emitted in every embodiment. Instead, only some of the colors may be emitted in a particular embodiment or the hue of a particular color may be modified in ways that are known to one of ordinary skill in the art. The use, for example, of LEDs emitting different colors and the use of techniques that may modify the hue of one or more colors may enable one to dynamically change the emitted colors based upon a user's needs.

A diffuser layer 1405 may be deposited on one side of phosphor layer 804. In the embodiment illustrated in FIG. 10, diffuser layer 1405 is disposed above phosphor layer 804. The diffuser layer 1405 may make light exiting the optic device more uniform than the light may be if only a phosphor layer is used. The diffuser layer can be a medium that has scattering particles (like micro spheres) mixed within it. In another alternative embodiment, the relative positions of the phosphor layer 804 and the diffuser layer 1405 may be switched. That is, the diffuser layer 1405 may be deposited directly on end 810 of optic device 802 and phosphor layer 804 may be deposited on top of the diffuser layer. In other words, diffuser layer 1405 may be disposed below phosphor layer 804. In yet another embodiment the phosphor layer 804 may be sandwiched between two diffuser layers 1405. That is, a first diffuser layer may be disposed on a first side of phosphor layer 804 and a second diffuser layer may be disposed on a second side of phosphor layer 804. In such an embodiment, for example, the first diffuser layer may be disposed above phosphor layer 804 and the second diffuser layer may be disposed below phosphor layer 804. It will be understood, however, and for example, that if the device 1400 is oriented differently, then the one or more diffuser layers may be on one or more sides of the phosphor layer, rather than being above and/or below the phosphor layer. In yet another alternative embodiment, diffuser layer 1405 need not be used. Instead, the phosphor 804 may be used as a diffuser to provide uniformity to the light. In yet another alternative embodiment, phosphor layer 804 need not be used. Instead, the diffuser layer 1405 may be used by itself, without phosphor layer 804 when multiple colored light sources are used. Regardless of whether a phosphor is used alone, a diffuser is used alone, or both a phosphor and a diffuser are used together, the purpose of using one or both of them may be to provide uniformity to the light and uniformity to any colors that may be emitted by the light emitting sources 1420, 1422, 1424.

If one or more of the light emitting sources emits blue light, and if element 804 is a phosphor, the blue light may be down converted as described elsewhere in this application resulting in the four components of radiation described elsewhere in this application. If one or more of the radiation emitting sources emits blue light, and if element 804 is not a phosphor but is different kind of diffuser material, the blue light impinging on the element 804 may not be down converted. If one or more of the light emitting sources emits, for example, red light or green light, or emits light of any color other than blue, such light may not be down converted whether element 804 is a phosphor material or other diffuser material. If blue light, green light, and red light all impinge on element 804 when a phosphor is used, white light may result depending upon the density of the phosphor.

Regardless of what colors are respectively emitted by the light emitting sources, and regardless of whether a phosphor or another diffuser material is used, when light from the light emitting sources 1420, 1422, 1424 impinges on the phosphor or other diffuser material, forward transferred radiation and back transferred radiation results. In the case of blue light impinging on a phosphor layer, the resulting components of radiation may be as described with respect to FIG. 12. In case of other colors impinging on a phosphor layer, the forward transferred light and the back transferred light may be same color as the impinging light. For example, if red light impinges on phosphor layer 804, the forward transferred light and the back transferred light may also be red light. The same results may obtain if a diffuser material other than phosphor is used.

The features pertaining to multiple colored light emitting sources described with respect to the embodiment illustrated in FIG. 10 may apply to each of the other embodiments disclosed in this application that use multiple colored light emitting sources.

Figure 11:
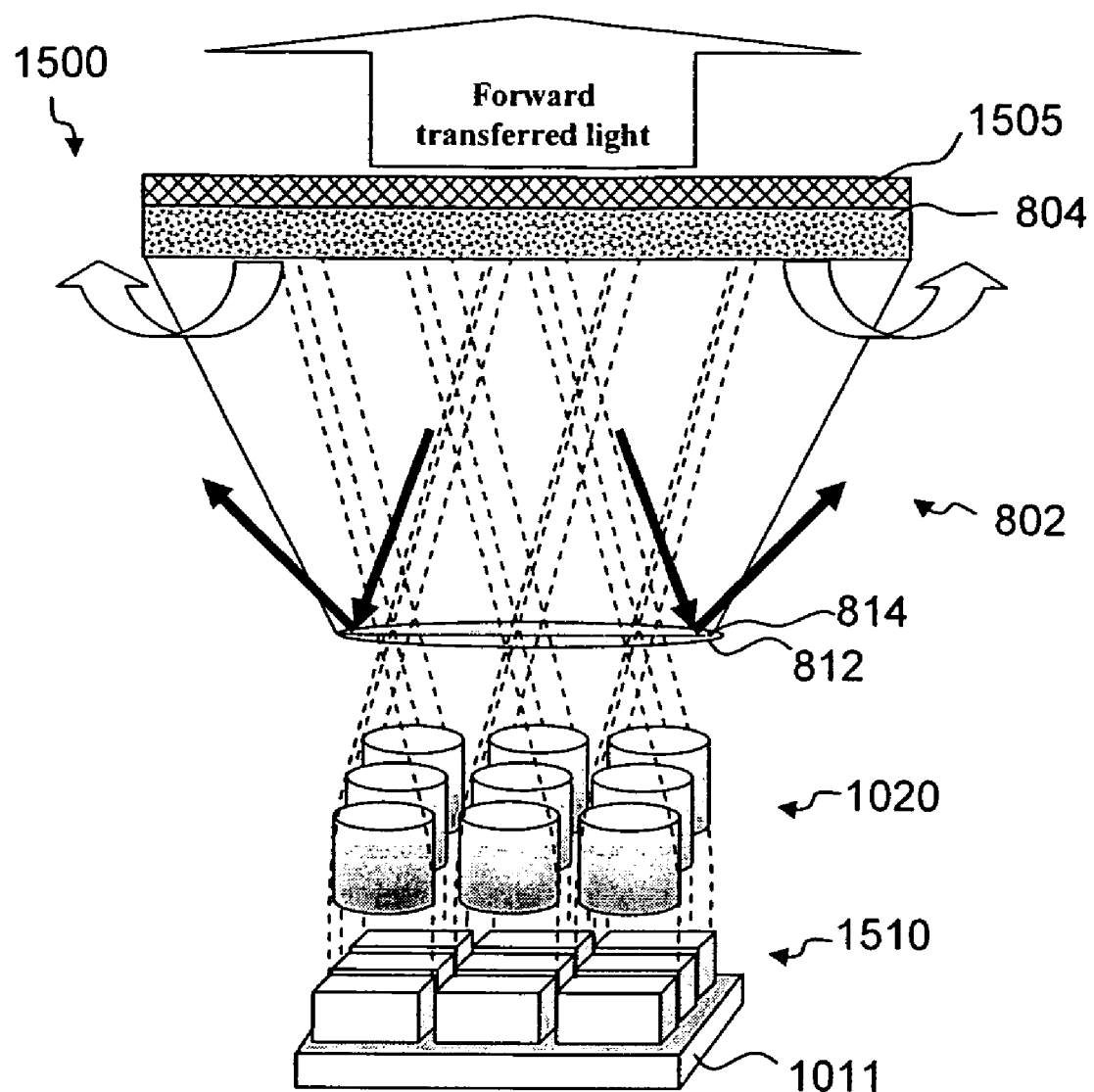
FIG. 11 is an exploded view of an another alternative embodiment of the present invention.

Yet another embodiment of the invention is illustrated in FIG. 11 that uses many of the elements of the embodiment illustrated in FIG. 7. The description of the embodiment illustrated in FIG. 7 is incorporated by reference. More particularly the embodiment illustrated in FIG. 11 is a device 1500 that has an optic device 802 with a phosphor layer 804 at one end portion and an inside reflective surface 814 at end portion 812. Although not shown in FIG. 11, there may be apertures or transparent areas in reflective surface 814. In a manner that is similar to the embodiment illustrated in other figures, short wavelength radiation entering optic device 802 through apertures or transparent areas in end 812 may bounce back and forth between phosphor layer 804 and reflective surface 814.

The embodiment illustrated in FIG. 11 includes an exemplary array of light emitting sources 1510 positioned outside optic device 802 and mounted on substrate 1011. FIG. 11 illustrates an array of nine light emitting sources. In alternative embodiments, more or fewer light emitting sources may be used in the array 1510. FIG. 11 also shows an exemplary array of lenses 1020 also disposed outside optic device 802 and positioned between the light emitting source array 1510 and optic device 802. The number of lenses in array 1020 desirably equals the number of light sources in light emitting source array 1510. Respective lenses in lens array 1020 may be aligned with respective light sources in light emitting source array 1510 and with respective apertures or transparent areas in surface 814.

In this embodiment, the light sources in light emitting source array 1510 may be multiple colored light emitting sources. The description of multiple colored light sources that are illustrated and described with respect to the embodiment illustrated in FIG. 10 is incorporated by reference. Individual ones of the light emitting sources may exhibit one or more colors. In an exemplary embodiment, one light emitting source may emit red light, a second light emitting source may emit green light, and a third light emitting source may emit blue light. That is, each of the light emitting sources may produce its own respective narrow band of radiation, or may produce both narrow bands and wide bands of radiation. Some of the light emitting sources may emit the same band of radiation. The band of radiation emitted by any or all of the light emitting sources may be adjustable so that the hue of each color may be adjusted.

Also in this embodiment, a diffuser layer 1505 may be deposited on the phosphor layer 804. Alternatively, the positions of the diffuser layer 1505 and the phosphor layer 804 may be switched. In a further alternative embodiment, the phosphor layer 804 may be sandwiched between two diffuser layers 1505. In yet another alternative embodiment, diffuser layer 1505 may not be used. In a still further embodiment, phosphor layer 804 need not be used. Instead, diffuser layer 1505 may be used without a phosphor layer, when multiple colored light sources are used.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A light emitting apparatus comprising:
   a radiation source for emitting short wavelength radiation;
   an optic device configured to receive short wavelength radiation emitted from the radiation source;
   a device for directing at least some of the short wavelength radiation emitted from the radiation source into the optic device;
   a first portion of the optic device having at least one aperture positioned to allow transfer of at least some of the short wavelength radiation emitted from the radiation source into the optic device; and
   a down conversion material receiving at least some of the short wavelength radiation directed into the optic device in one spectral region and emitting at least some of the received radiation in at least one other spectral region.

2. The light emitting apparatus of claim 1, wherein the radiation source includes at least one of a light emitting diode (LED), a laser diode (LD), or a resonant cavity light emitting diode (RCLED).

3. The light emitting apparatus of claim 1, wherein the short wavelength radiation source includes at least one of a light emitting diode (LED), a laser diode (LD), or a resonant cavity light emitting diode (RCLED) and the device for directing at least some of the radiation emitted from the source is one of a lens, a GRIN lens, a micro lens, or a ball lens.

4. The light emitting apparatus of claim 1, wherein the down conversion material includes one of a phosphor or other material for converting at least some of the received light into forward transferred light and back transferred radiation.

5. The light emitting apparatus of claim 1, wherein the down conversion material includes non down converting scattering particles.

6. The light emitting apparatus of claim 1, wherein the radiation source is disposed outside the optic device.

7. The light emitting apparatus of claim 1, wherein the device for directing at least some of the short wavelength radiation emitted from the radiation source is disposed outside the optic device.

8. The light emitting apparatus of claim 1, wherein the radiation source and the device for directing at least some of the radiation emitted from the radiation source are disposed outside the optic device.

9. The light emitting apparatus of claim 1, wherein the device for directing at least some of the short wavelength and down converted radiation is disposed between the radiation source and the optic device.

10. The light emitting apparatus of claim 1, further including a reflector disposed around at least a portion of the optic device.

11. The light emitting apparatus of claim 1, wherein a geometric shape of the optic device includes one of a cone, sphere, hyperbola, parabola, ellipse, pyramid or box shape.

12. The light emitting apparatus of claim 1, wherein radiation inside the optic device includes at least one of back transferred radiation from the down conversion material, radiation from the radiation source and radiation emitted, scattered and/or reflected within the optic device and wherein the optic device is adapted to extract radiation from inside the optic device to outside of the optic device.

13. The light emitting apparatus of claim 12, further comprising a collecting device for collecting light extracted to outside of the optic device.

14. The light emitting apparatus of claim 13, wherein the collecting device includes a reflector disposed around at least a portion of the optic device.

15. The light emitting apparatus of claim 1, wherein the radiation source is disposed adjacent a first portion of the optic device.

16. The light emitting apparatus of claim 15, wherein the radiation source is disposed inside at least one reflector.

17. The light emitting apparatus of claim 16, wherein a shape of the at least one reflector is one of concave, parabolic, or flat.

18. The light emitting apparatus of claim 16, wherein the radiation source is a light emitting diode and a shape of the at least one reflector is substantially parabolic.

19. The light emitting apparatus of claim 15, wherein the down conversion material is disposed adjacent a second portion of the optic device.

20. The light emitting apparatus of claim 15, wherein the down conversion material is disposed adjacent a second end of the optic device and further comprising a diffuser layer disposed at least one of adjacent a first side of the down conversion material or adjacent a second side of the down conversion material.

21. The light emitting apparatus of claim 15, wherein the down conversion material is disposed adjacent a second portion of the optic device and further comprising a first diffuser layer disposed adjacent a first side of the down conversion material and a second diffuser layer disposed adjacent a second side of the down conversion material.

22. The light emitting apparatus of claim 15, wherein an inside surface at the first portion of the optic device is a reflective surface.

23. The light emitting apparatus of claim 22, further comprising one of a plurality of bumps or a plurality of conical sections on the reflective surface of the optic device.

24. The light emitting apparatus of claim 1 wherein the radiation source comprises a source for emitting multi-colored light.

25. The light emitting apparatus of claim 1, wherein the radiation source comprises a plurality of light emitting sources, each of the light emitting sources exhibiting a spectrum different than a spectrum of at least some of the other light emitting sources.

26. A light emitting apparatus comprising:
a radiation source for emitting short wavelength radiation, the radiation source including a plurality of semiconductor light emitters, including at least one of a light emitting diode (LED), a laser diode (LD), or a resonant cavity light emitting diode (RCLED);
an optic device configured to receive short wavelength radiation emitted from the plurality of semiconductor light emitters;
a device for directing at least some of the short wavelength radiation emitted from the plurality of semiconductor light emitters into the optic device;
a first portion of the optic device has a plurality of apertures positioned to allow transfer of at least some of the short wavelength radiation from the plurality of semiconductor light emitters into the optic device;
a down conversion material receiving at least some of the short wavelength radiation directed into the optic device in one spectral region and emitting at least some of the received radiation in at least one other spectral region.

27. The light emitting apparatus of claim 26, wherein a plurality of lenses direct the short wavelength radiation from respective semiconductor light emitters through respective apertures.

28. The light emitting apparatus of claim 27, wherein respective semiconductor light emitters are aligned with respective lenses and apertures or transparent areas.

29. The light emitting apparatus of claim 26, wherein respective semiconductor light emitters are disposed one of inside or on respective ones of a plurality of reflectors.

30. The light emitting apparatus of claim 26, wherein the plurality of semiconductor light emitters are disposed outside the optic device.

31. The light emitting apparatus of claim 26, wherein the device for directing at least some of the light emitted from the plurality of semiconductor light emitters is disposed between the plurality of semiconductor light emitters and the optic device.

32. The light emitting apparatus of claim 31 wherein the device for directing at least some of the light from the plurality of semiconductor light emitters is a micro lens layer.

33. A light emitting apparatus comprising:
a radiation source for emitting multi-colored radiation;
an optic device configured to receive at least a portion of the multi-colored radiation emitted by the radiation source;
a device for directing at least some of the multi-colored radiation emitted by the radiation source into the optic device;
a first portion of the optic device having at least one aperture positioned to allow transfer of at least some of the multi-colored radiation emitted from the radiation source into the optic device; and a diffuser material coupled to the optic device receiving at least some of the multi-colored radiation and converting the received multi-colored radiation into forward transferred radiation and back transferred radiation, wherein the optic device is configured to extract at least a portion of the back transferred radiation from the optic device.

34. The light emitting apparatus of claim 33, wherein the radiation source comprises a plurality of light emitting sources, each of the light emitting sources exhibiting a spectrum different than a spectrum of at least one of the other light emitting sources.

35. The light emitting apparatus of claim 33 wherein the diffuser material is at least one of a diffuser, a down conversion material, and a microlens.

* * * * *